(12) United States Patent
Kim

(10) Patent No.: US 11,184,108 B2
(45) Date of Patent: Nov. 23, 2021

(54) METHOD AND APPARATUS FOR TRANSMITTING AND RECEIVING SIGNAL USING POLAR CODE IN COMMUNICATION SYSTEM

(71) Applicant: Electronics and Telecommunications Research Institute, Daejeon (KR)

(72) Inventor: Nam Il Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/945,324

(22) Filed: Jul. 31, 2020

(65) Prior Publication Data
US 2021/0036805 A1   Feb. 4, 2021

(30) Foreign Application Priority Data

Aug. 2, 2019 (KR) .................. 10-2019-0094367
Jun. 19, 2020 (KR) .................. 10-2020-0075000

(51) Int. Cl.
| | | |
|---|---|---|
| *H04L 1/00* | (2006.01) | |
| *H03M 13/00* | (2006.01) | |
| *H03M 13/15* | (2006.01) | |
| *H03M 13/27* | (2006.01) | |
| *H03M 13/25* | (2006.01) | |

(52) U.S. Cl.
CPC .......... *H04L 1/0041* (2013.01); *H03M 13/15* (2013.01); *H03M 13/251* (2013.01); *H03M 13/27* (2013.01); *H03M 13/6325* (2013.01); *H04L 1/0045* (2013.01); *H04L 1/0057* (2013.01); *H04L 1/0071* (2013.01)

(58) Field of Classification Search
CPC .... H03M 13/13; H03M 13/27; H03M 13/251; H03M 13/2796; H03M 13/6325; H04L 1/0041; H04L 1/0057; H04L 1/0058; H04L 4/0067; H04L 1/0071
See application file for complete search history.

(56) References Cited

U.S. PATENT DOCUMENTS

| | | | |
|---|---|---|---|
| 9,461,775 B2 * | 10/2016 | Chen ................... | H04L 27/2636 |
| 9,479,291 B2 | 10/2016 | Mahdavifar et al. | |
| 10,341,044 B2 | 7/2019 | Zhang et al. | |
| 10,425,111 B2 | 9/2019 | Wu et al. | |

(Continued)

FOREIGN PATENT DOCUMENTS

KR     1020160100225 A     8/2016

*Primary Examiner* — Shelly A Chase
(74) *Attorney, Agent, or Firm* — William Park & Associates Ltd.

(57) ABSTRACT

A method of processing a transmission signal may comprise grouping a coded bit sequence including a plurality of coded bits into a plurality of groups; comparing indices of code bits belonging to a first group among the plurality of groups and indices of code bits belonging to a second group among the plurality of groups; configuring the coded bits belonging to the first group as higher bits among bits constituting each modulation symbol based on a result of comparing the indices of the coded bits; configuring the coded bits belonging to the second group as lower bits among the bits constituting each modulation symbol based on the result of comparing the indices of the code bits; and generating the each modulation symbol by using the higher bits and the lower bits.

20 Claims, 19 Drawing Sheets

(56) References Cited

U.S. PATENT DOCUMENTS

| | | |
|---|---|---|
| 2017/0338996 A1 | 11/2017 | Sankar et al. |
| 2018/0198564 A1* | 7/2018 | Yang ..................... H04L 1/0067 |
| 2018/0278380 A1 | 9/2018 | Kim et al. |
| 2018/0331783 A1 | 11/2018 | Ahn et al. |
| 2019/0044540 A1* | 2/2019 | Jiang ................. H03M 13/2796 |
| 2019/0053218 A1 | 2/2019 | Kim et al. |
| 2019/0089380 A1 | 3/2019 | Shen et al. |
| 2019/0260503 A1 | 8/2019 | Zhang et al. |
| 2020/0186284 A1* | 6/2020 | Noh ..................... H04L 1/0067 |

* cited by examiner

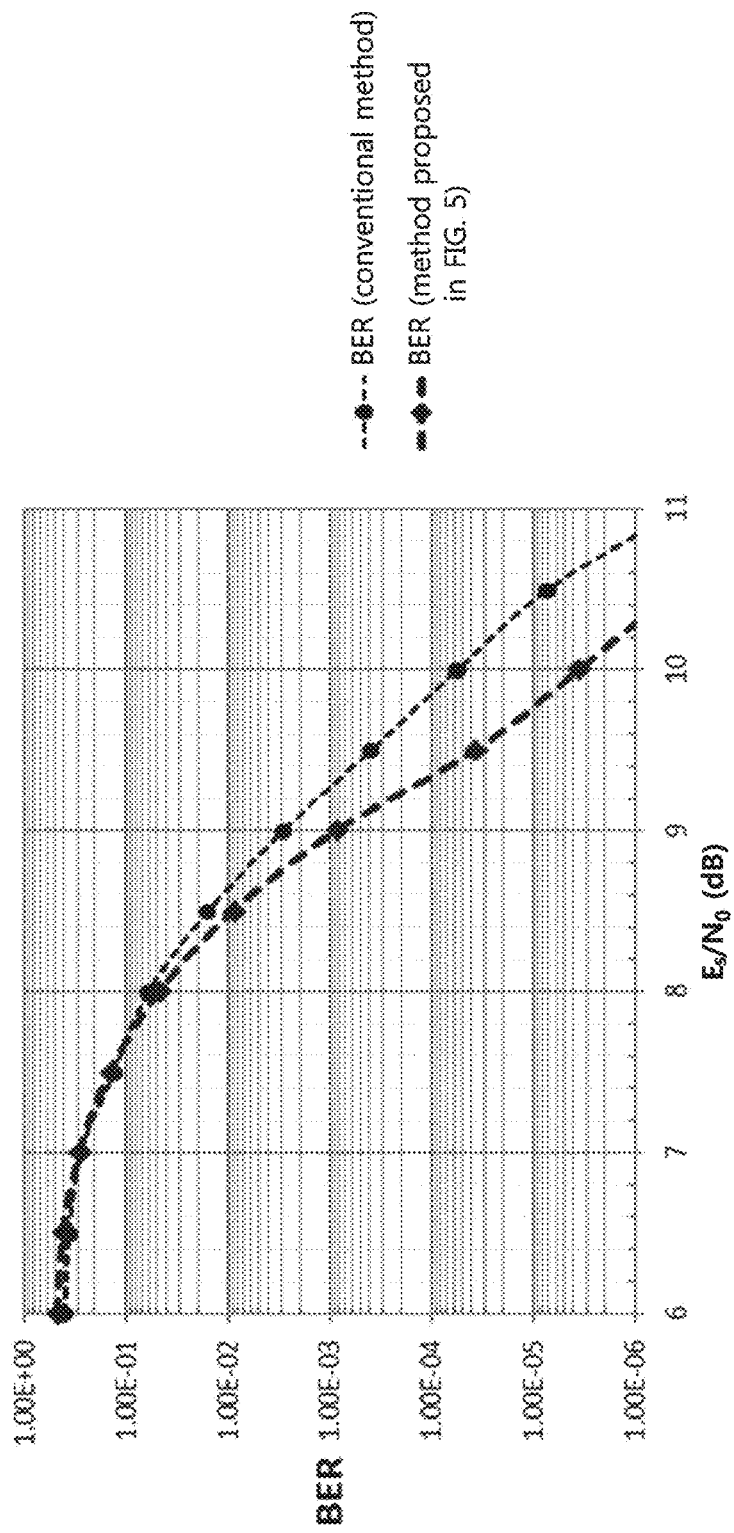

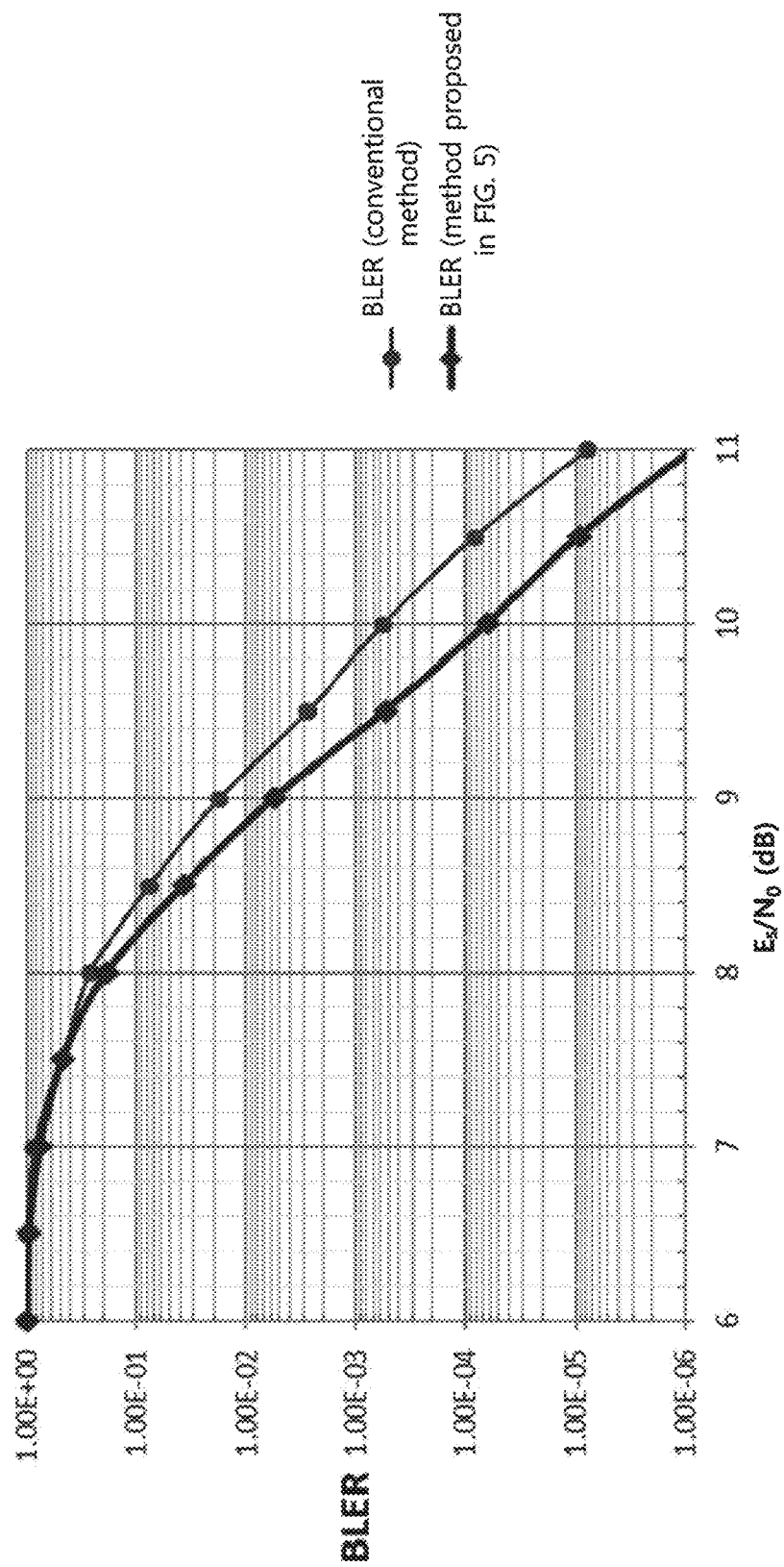

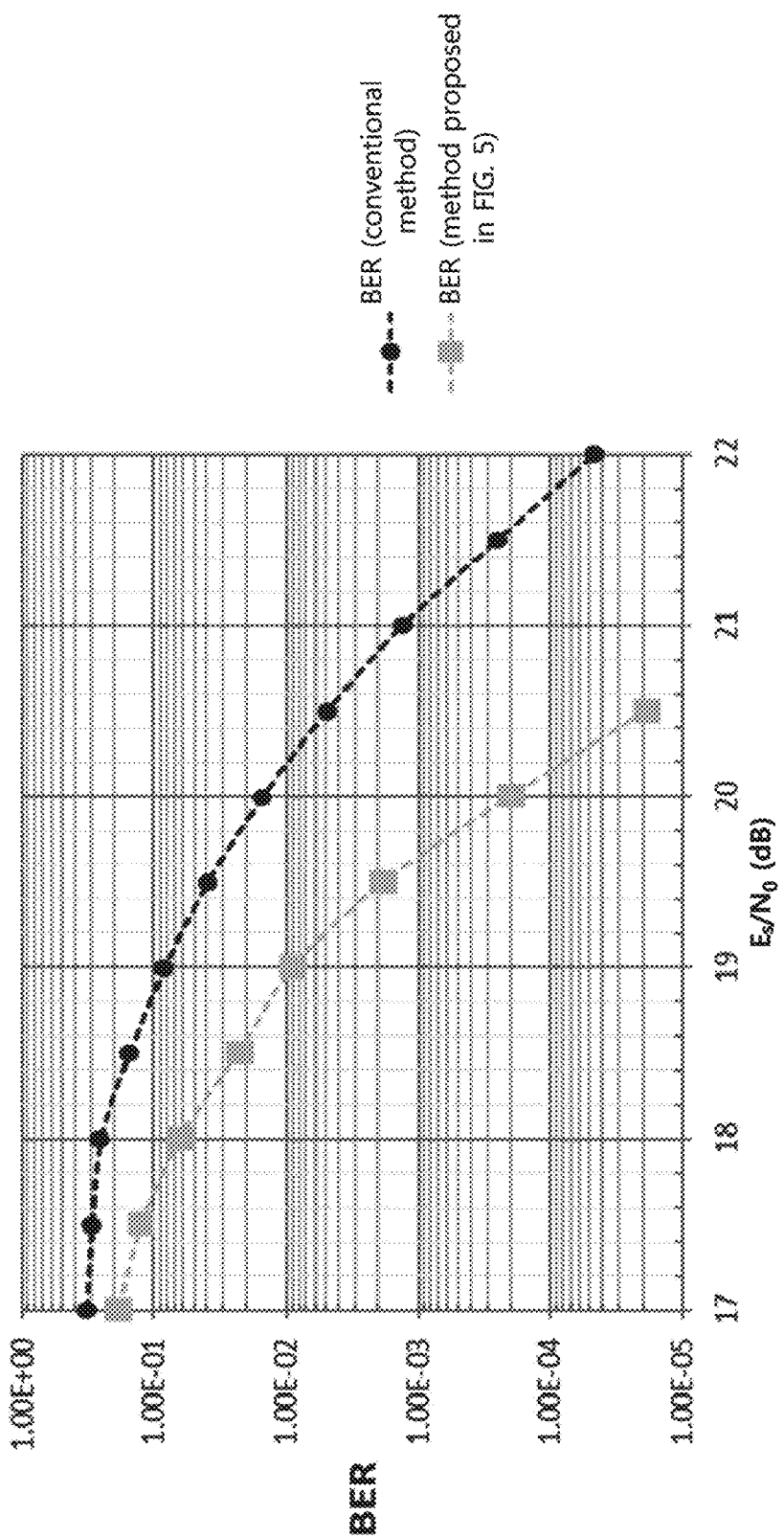

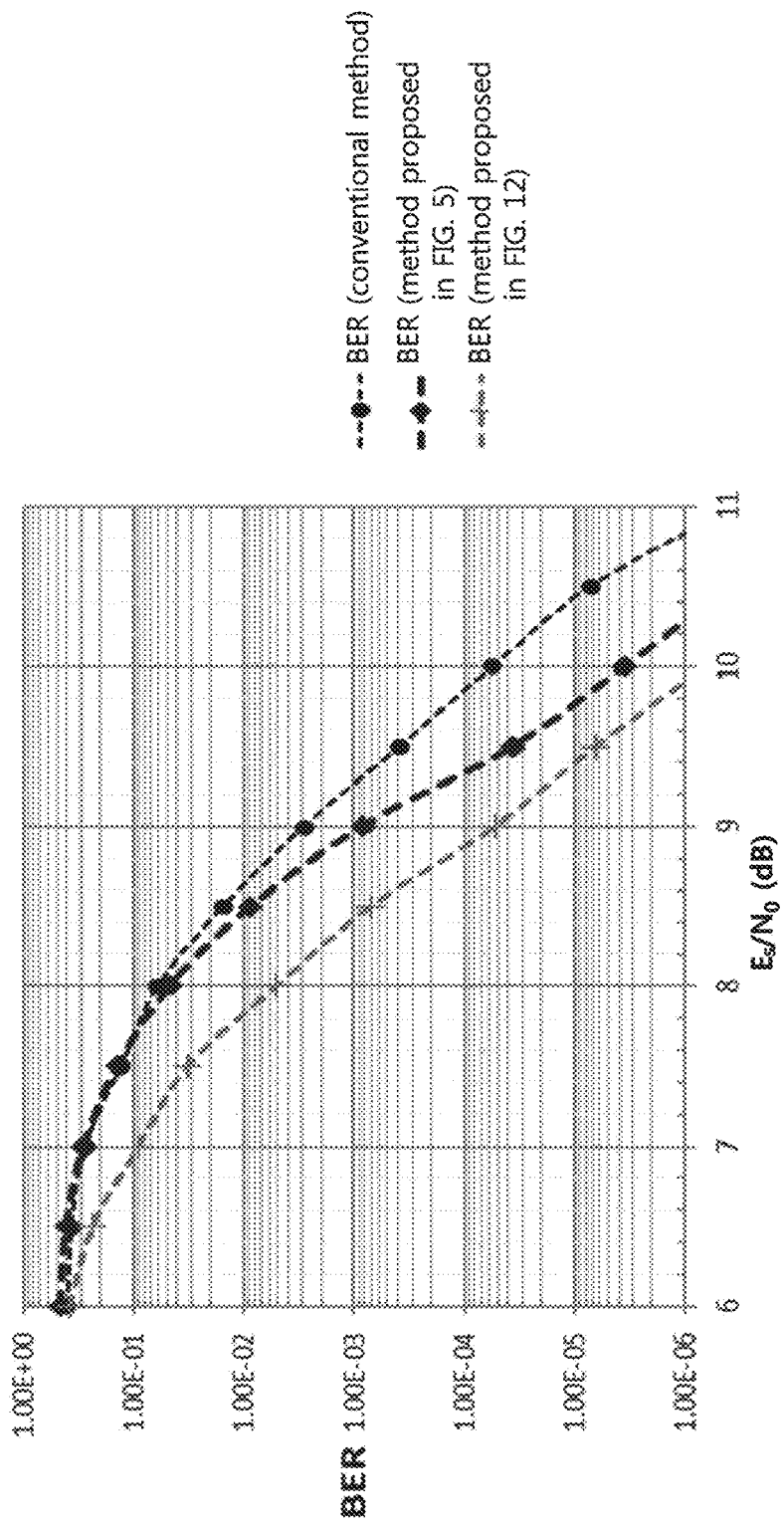

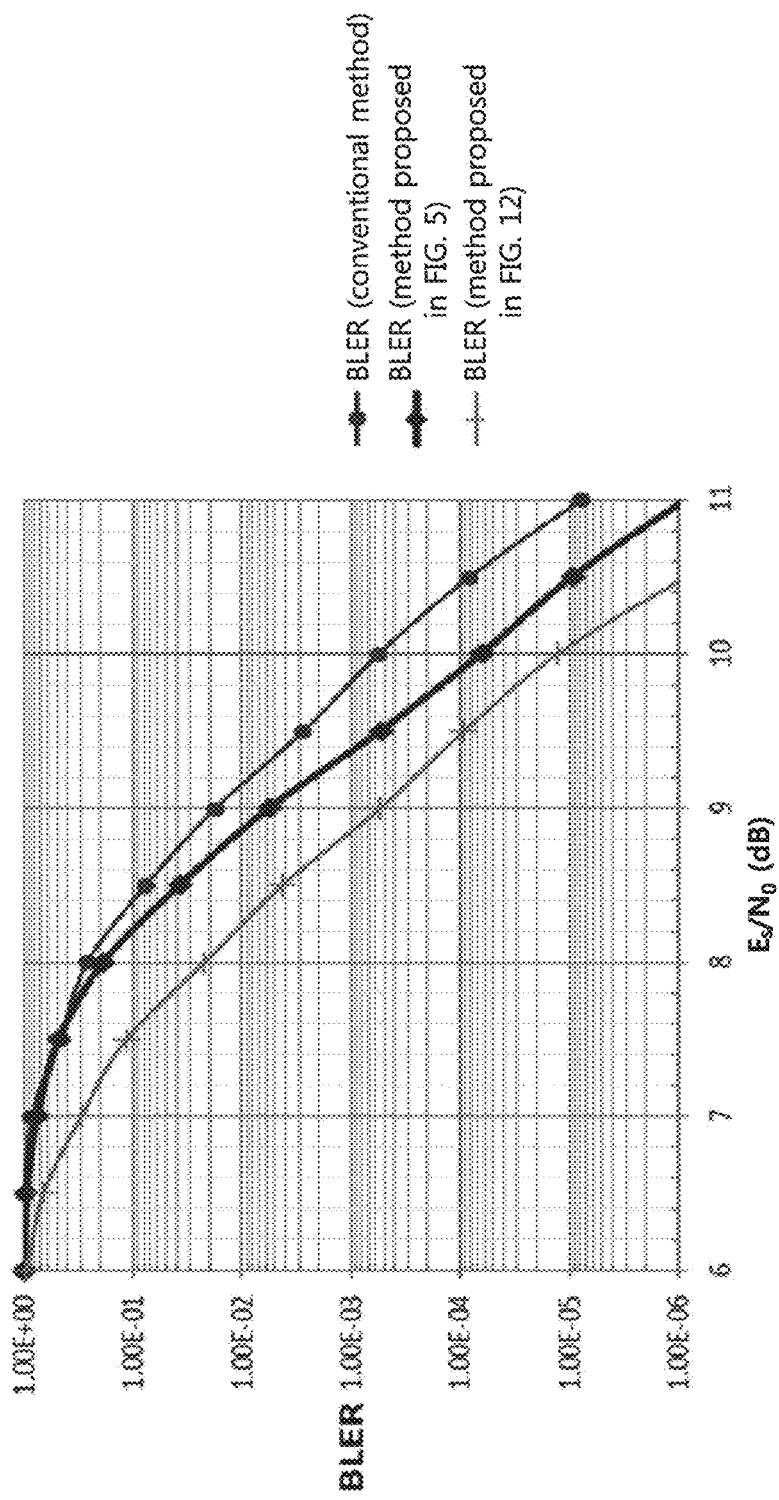

METHOD AND APPARATUS FOR TRANSMITTING AND RECEIVING SIGNAL USING POLAR CODE IN COMMUNICATION SYSTEM

CROSS-REFERENCE TO RELATED APPLICATIONS

This application claims priority to Korean Patent Applications No. 10-2019-0094367 filed on Aug. 2, 2019, and No. 10-2020-0075000 filed on Jun. 19, 2020 with the Korean Intellectual Property Office (KIPO), the entire contents of which are hereby incorporated by reference.

BACKGROUND

1. Technical Field

The present disclosure relates to a technique for signal processing in a communication system, and more specifically, to a technique for transmitting and receiving a signal by using a polar code.

2. Related Art

The communication system (hereinafter, a new radio (NR) communication system) using a higher frequency band (e.g., a frequency band of 6 GHz or higher) than a frequency band (e.g., a frequency band lower below 6 GHz) of the long term evolution (LTE) (or, LTE-A) is being considered for processing of soaring wireless data. The NR communication system may support not only a frequency band below 6 GHz but also 6 GHz or higher frequency band, and may support various communication services and scenarios as compared to the LTE communication system. For example, usage scenarios of the NR communication system may include enhanced mobile broadband (eMBB), ultra-reliable low-latency communication (URLLC), massive machine type communication (mMTC), and the like.

Meanwhile, technologies for improving a data throughput and technologies for efficiently using a frequency band have been developed. In order to improve error correction capability, a channel encoding technique using a polar code has been developed. The polar code may be a code that corrects an error using a characteristic of channel polarization in order to improve the overall transmission capacity of the communication system (e.g., LTE communication system, NR communication system, or the like).

In the communication system, a communication node (e.g., base station or terminal) may perform communications using a polar code. For example, a transmitting communication node may generate coded bits by encoding bits (e.g., information bits) by using a polar code, generate modulation symbols by performing a modulation operation on the coded bits, and transmit the modulation symbols through a radio resource. A receiving communication node may obtain soft bits by performing a demodulation operation on a received signal, and obtain the information bits by performing decoding on the soft bits based on the polar code.

When the polar code is used in the communication system, the information bits may be designed to be transmitted over a channel with a relatively high reliability, and frozen bits may be designed to be transmitted over a channel with a relatively low reliability. In order to improve the data throughput in the communication system using the polar code, a high order quadrature amplitude modulation (QAM) scheme may be used. In this case, methods for efficiently mapping coded bits to modulation symbol(s) are needed.

SUMMARY

Accordingly, exemplary embodiments of the present disclosure provide methods and apparatuses for transmitting and receiving a signal by using a polar code.

According to a first exemplary embodiment of the present disclosure, a method of processing a transmission signal, performed by a communication node in a communication system, may comprise grouping a coded bit sequence including a plurality of coded bits into a plurality of groups; comparing indices of code bits belonging to a first group among the plurality of groups and indices of code bits belonging to a second group among the plurality of groups; configuring the coded bits belonging to the first group as higher bits among bits constituting each modulation symbol based on a result of comparing the indices of the coded bits; configuring the coded bits belonging to the second group as lower bits among the bits constituting each modulation symbol based on the result of comparing the indices of the code bits; and generating the each modulation symbol by using the higher bits and the lower bits.

The coded bit sequence may be a result of polar encoding for a mother coded bit sequence including information bits and frozen bits arranged according to channel reliability.

The number of the plurality of groups may be half a number of bits constituting each modulation symbol.

The plurality of groups may be configured according to an order of indices of the plurality of coded bits, and indices of code bits belonging to each of the plurality of groups may be consecutive.

Each of the higher bits and the lower bits may be configured in units of 2 bits.

When the indices of the coded bits belonging to the first group may be greater than the indices of the coded bits belonging to the second group, the coded bits belonging to the first group may be configured as the higher bits, and the coded bits belonging to the second group may be configured as the lower bits.

The method may further comprise arranging the plurality of coded bits included in the coded bit sequence according to channel reliability, wherein the plurality of groups are configured based on the plurality of coded bits arranged according to channel reliability.

The method may further comprise changing an arrangement order of the plurality of groups; and resetting the indices of the plurality of coded bits belonging to the plurality of groups arranged based on the changed arrangement order, according to a preconfigured rule, wherein in the comparing of the indices of the coded bits, the indices reset according to the preconfigured rule are compared.

The method may further comprise performing an interleaving operation on the plurality of groups; and resetting the indices of the plurality of coded bits belonging to the plurality of groups to which the interleaving operation is applied, according to a preconfigured rule, wherein in the comparing of the indices of the coded bits, the indices reset according to the preconfigured rule are compared.

According to a second exemplary embodiment of the present disclosure, a method of processing a received signal, performed by a communication node in a communication system, may comprise obtaining log likelihood ratio (LLR) value(s) by performing a demodulation operation on a plurality of modulation symbols included in a received signal; placing LLR value(s) associated with higher bits among bits constituting each of the plurality of modulation symbols in a first group among a plurality of groups; placing LLR value(s) associated with lower bits among the bits constituting each of the plurality of modulation symbols in a second group among the plurality of groups; generating an LLR sequence by performing a de-grouping operation on the first group and the second group; and obtaining a bit sequence by performing a polar decoding operation on the LLR sequence.

The method may further comprise re-arranging the LLR sequence according to channel reliability, wherein the polar decoding operation is performed on the re-arranged LLR sequence.

The number of the plurality of groups may be half a number of bits constituting each modulation symbol.

The bit sequence may include information bits and frozen bits, and the information bits may be re-arranged according to channel reliability.

According to a third exemplary embodiment of the present disclosure, a communication node for performing a processing operation of a transmission signal in a communication system may comprise a processor; a memory electronically communicating with the processor; and instructions stored in the memory, wherein when executed by the processor, the instructions cause the communication node to: group a coded bit sequence including a plurality of coded bits into a plurality of groups; compare indices of code bits belonging to a first group among the plurality of groups and indices of code bits belonging to a second group among the plurality of groups; configure the coded bits belonging to the first group as higher bits among bits constituting each modulation symbol based on a result of comparing the indices of the coded bits; configure the coded bits belonging to the second group as lower bits among the bits constituting each modulation symbol based on the result of comparing the indices of the code bits; and generate the each modulation symbol by using the higher bits and the lower bits.

The number of the plurality of groups may be half a number of bits constituting each modulation symbol.

The plurality of groups may be configured according to an order of indices of the plurality of coded bits, and indices of code bits belonging to each of the plurality of groups may be consecutive.

When the indices of the coded bits belonging to the first group are greater than the indices of the coded bits belonging to the second group, the coded bits belonging to the first group may be configured as the higher bits, and the coded bits belonging to the second group may be configured as the lower bits.

The instructions may further cause the communication node to arrange the plurality of coded bits included in the coded bit sequence according to channel reliability, wherein the plurality of groups are configured based on the plurality of coded bits arranged according to channel reliability.

The instructions may further cause the communication node to: change an arrangement order of the plurality of groups; and reset the indices of the plurality of coded bits belonging to the plurality of groups arranged based on the changed arrangement order, according to a preconfigured rule, wherein in the comparing of the indices of the coded bits, the indices reset according to the preconfigured rule are compared.

The instructions may further cause the communication node to: perform an interleaving operation on the plurality of groups; and reset the indices of the plurality of coded bits belonging to the plurality of groups to which the interleaving operation is applied, according to a preconfigured rule, wherein in the comparing of the indices of the coded bits, the indices reset according to the preconfigured rule are compared.

According to the exemplary embodiments of the present disclosure, in the procedure for processing a transmission signal, an output bit sequence of the polar encoder can be arranged based on channel reliability, and grouping, arrangement, and modulation operations on the arranged bit sequence can be performed. The procedure for processing a received signal may be performed in the reverse order of the procedure for processing the transmission signal. The bit error rate (BER) and block error rate (BLER) according to the proposed methods can be reduced compared to the BER and BLER according to the conventional method. Therefore, the data transmission efficiency can be improved, and the performance of the communication system can be improved.

BRIEF DESCRIPTION OF DRAWINGS

Exemplary embodiments of the present disclosure will become more apparent by describing in detail embodiments of the present disclosure with reference to the accompanying drawings, in which:

FIG. 10A is a first graph showing a BER according to the method shown in FIG. 5 and a BER according to the conventional method;

FIG. 10B is a first graph showing a BLER according to the method shown in FIG. 5 and a BLER according to the conventional method.

FIG. 11A is a second graph showing a BER according to the method shown in FIG. 5 and a BER according to the conventional method;

FIG. 14A is a first graph showing a BER according to the method shown in FIG. 12 and a BER according to the conventional method;

FIG. 14B is a first graph showing a BLER according to the method shown in FIG. 12 and a BLER according to the conventional method;

FIG. 154 is a second graph showing a BER according to the method shown in FIG. 12 and a BER according to the conventional method.

Figure 1:
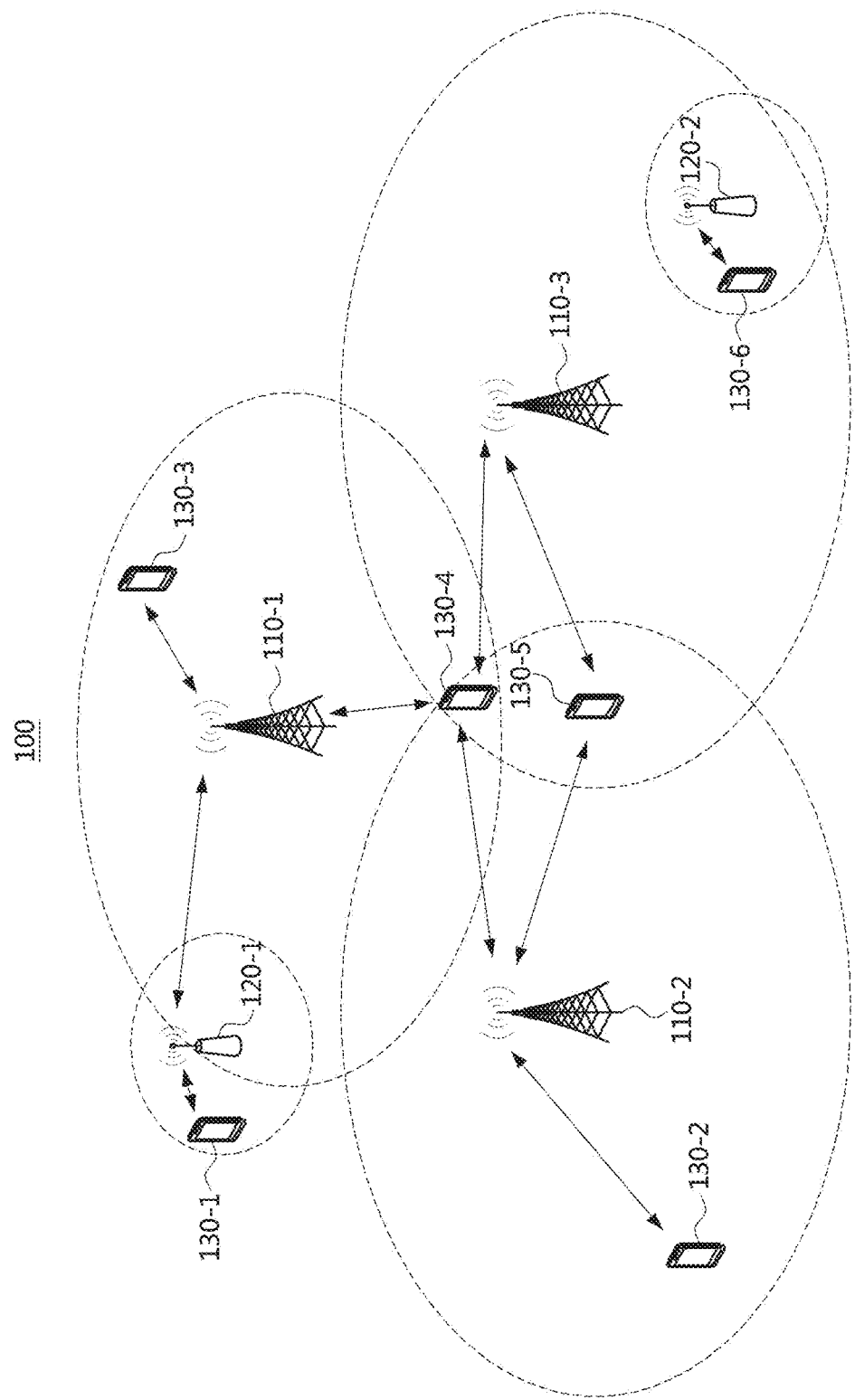
FIG. 1 is a conceptual diagram illustrating a first exemplary embodiment of a communication system.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similar a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

A communication system to which exemplary embodiments according to the present disclosure are applied will be described. The communication system to which the exemplary embodiments according to the present disclosure are applied is not limited to the contents described below, and the exemplary embodiments according to the present disclosure may be applied to various communication networks. Here, the communication system may be used in the same sense as a communication network.

FIG. 1 is a conceptual diagram illustrating a first exemplary embodiment of a communication system.

Referring to FIG. 1, a communication network 100 may comprise a plurality of communication nodes 110-1, 110-2, 110-3, 120-1, 120-2, 130-1, 130-2, 130-3, 130-4, 130-5, and 130-6. The plurality of communication nodes may support 4th generation (4G) communication (e.g., long term evolution (LTE), LTE-advanced (LTE-A)), 5th generation (5G) communication (e.g., new radio (NR)), or the like. The 4G communication may be performed in a frequency band of 6 gigahertz (GHz) or below, and the 5G communication may be performed in a frequency band of 6 GHz or above.

For example, for the 4G and 5G communications, the plurality of communication nodes may support a code division multiple access ((DMA) based communication protocol, a wideband (DMA (WCDMA) based communication protocol, a time division multiple access (TDMA) based communication protocol, a frequency division multiple access (FDMA) based communication protocol, an orthogonal frequency division multiplexing (OFDM) based communication protocol, a filtered OFDM based communication protocol, a cyclic prefix OFDM (CP-OFDM) based communication protocol, a discrete Fourier transform spread OFDM (DFT-s-OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, a generalized frequency division multiplexing (GFDM) based communication protocol, a filter bank multi-carrier (UFMC) based communication protocol, a universal filtered multi-carrier (UFMC) based communication protocol, a space division multiple access (SDMA) based communication protocol, or the like.

Also, the communication network 100 may further include a core network. When the communication system 100 supports the 4G communication, the core network may comprise a serving gateway (S-GW), a packet data network (PDN) gateway (P-GW), a mobility management entity (MME), and the like. When the communication system 100 supports the 5G communication, the core network may comprise a user plane function (UPF), a session management function (SMF), an access and mobility management function (AMF), and the like.

Meanwhile, each of the plurality of communication nodes 110-1, 110-2, 110-3, 120-1, 120-2, 130-1, 130-2, 130-3, 130-4, 130-5, and 130-6 constituting the communication network 100 may have the following structure.

Figure 2:
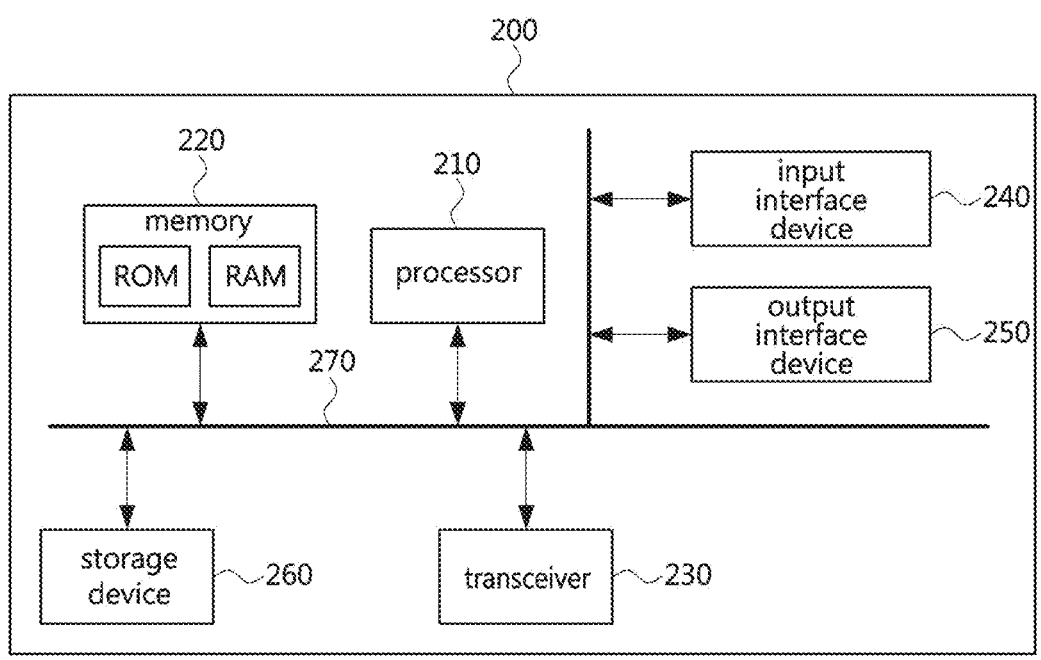
FIG. 2 is a block diagram illustrating a first exemplary embodiment of a communication node constituting a communication system.

FIG. 2 is a block diagram illustrating a first embodiment of a communication node constituting a communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

However, each component included in the communication node 200 may be connected to the processor 210 via an individual interface or a separate bus, rather than the common bus 270. For example, the processor 210 may be connected to at least one of the memory 220, the transceiver 230, the input interface device 240, the output interface device 250, and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication network 100 may comprise a plurality of base stations 110-1, 110-2, 110-3, 120-1, and 120-2, and a plurality of terminals 130-1, 130-2, 130-3, 130-4, 130-5, and 130-6. The communication network 100 including the base stations 110-1, 110-2, 110-3, 120-1, and 120-2 and the terminals 130-1, 130-2, 130-3, 130-4, 130-5, and 130-6 may be referred to as an 'access network'. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a base transceiver station (BTS), a radio base station, a radio transceiver, an access point, an access node, a road side unit (RSU), a radio remote head (RRH), a transmission point (TP), a transmission and reception point (TRP), an eNB, a gNB, or the like. Each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, an Internet of things (IoT) device, a mounted apparatus (e.g., a mounted module/device/terminal or an on-board device/terminal, etc.), or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Also, each of the plurality of base stations 110-1, 110-2, 110-3, 120-1, and 120-2 may support multi-input multi-output (MIMO) transmission (e.g., a single-user MIMO (SU-MIMO), multi-user MIMO (MU-MIMO), massive MIMO, or the like), coordinated multipoint (COMP) transmission, carrier aggregation (CA) transmission, transmission in an unlicensed band, device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2, and operations supported by the plurality of base stations 110-1, 110-2, 110-3, 120-1, and 120-2. For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner.

The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, methods for transmitting and receiving a signal by using a polar code in a communication system will be described. Even when a method (e.g., transmission or reception of a data packet) performed at a first communication node among communication nodes is described, the corresponding second communication node may perform a method (e.g., reception or transmission of the data packet) corresponding to the method performed at the first communication node. That is, when an operation of a terminal is described, the corresponding base station may perform an operation corresponding to the operation of the terminal. Conversely, when an operation of the base station is described, the corresponding terminal may perform an operation corresponding to the operation of the base station.

Figure 3:
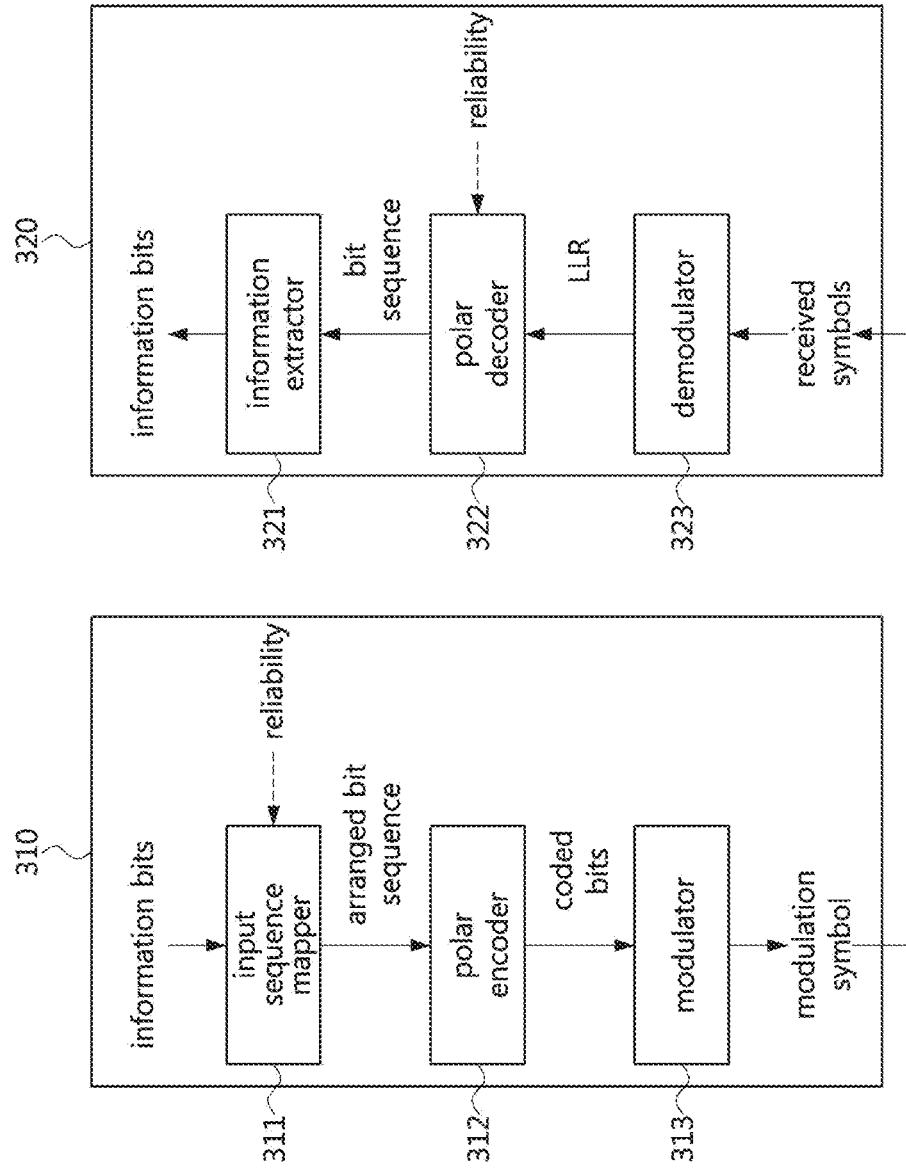
FIG. 3 is a conceptual diagram illustrating a first exemplary embodiment of a method of transmitting and receiving a signal based on a polar code in a communication system.

FIG. 3 is a conceptual diagram illustrating a first exemplary embodiment of a method of transmitting and receiving a signal based on a polar code in a communication system.

Referring to FIG. 3, a communication system may include a transmitting node 310 and a receiving node 320. Each of the transmitting node 310 and the receiving node 320 may be a base station (e.g., base station 110-1, 110-2, 110-3, 120-1, or 120-2 shown in FIG. 1) or a terminal (e.g. terminal 130-1, 130-2, 130-3, 130-4, 130-5, or 130-6 shown in FIG. 1). When the transmitting node 310 is a base station, the receiving node 320 may be a terminal. Alternatively, when the transmitting node 310 is a terminal, the receiving node 320 may be a base station or another terminal. Each of the transmitting node 310 and the receiving node 320 may be configured to be the same as or similar to the communication node 200 shown in FIG. 2.

The transmitting node 310 may include an input sequence mapper 311, a polar encoder 312, and a modulator 313. The operation(s) of each of the input sequence mapper 311, the polar encoder 312, and the modulator 313 may be performed on the processor 210 shown in FIG. 2. The processor 210 may perform the operation(s) of each of the input sequence mapper 311, the polar encoder 312, and the modulator 313 by executing the instruction(s) stored in the memory 220 shown in FIG. 2.

The receiving node 320 may include an information extractor 321, a polar decoder 322, and a demodulator 323. The operation(s) of each of the information extractor 321, the polar decoder 322, and the demodulator 323 may be performed on the processor 210 shown in FIG. 2. The processor 210 may perform the operation(s) of each of the information extractor 321, the polar decoder 322, and the demodulator 323 by executing the instruction(s) stored in the memory 220 shown in FIG. 2.

The input sequence mapper 311 may perform a mapping operation of bits based on reliability of channel(s). In the exemplary embodiments, bits may mean a bit string or a bit sequence. For example, the input sequence mapper 311 may map information bits to a channel having a relatively high reliability, and map frozen bits to a channel having a relatively low reliability. A method of mapping the bits according to reliability may be performed as follows.

For example, the length K of the information bits may be 8, and the length N of mother coded bits may be 16. The length M of the frozen bits may be determined based on Equation 1 below. For example, the length M of the frozen bits may be 8. That is, the information bits may have a length of 8 bits, the mother coded bits may have a length of 16 bits, and the frozen bits may have a length of 8 bits.

$$M=N-K \quad \text{[Equation 1]}$$

The mother coded bits may include the information bits and the frozen bits. The bit indices Q for the mother coded bits having a length of 16 bits may be configured as shown in Table 1 below.

TABLE 1

| Bit index Q | | | | | | | | | | | | | | | |
|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 |

The bits included in the mother coded bits may be arranged according to the reliability (e.g., channel reliability). When the reliability W(Q) is defined as shown in Table 2 below, among the bits constituting the mother coded bits, bits #6, #7, #10, #11, #12, 113, #14, and #15 may be placed in an important region within the arranged bit sequence.

TABLE 2

| Reliability W(Q) | | | | | | | | | | | | | | | |
|---|---|---|---|---|---|---|---|---|---|---|---|---|---|---|---|
| 0 | 1 | 2 | 5 | 3 | 6 | 8 | 11 | 4 | 7 | 9 | 12 | 10 | 13 | 14 | 15 |

In this case, the input sequence mapper 311 may map the information bits to bits #6, #7, #10, #11, #12, #13, #14, and #15 within the mother coded bits. The mapping order of the information bits may be {bit #6, bit #7, bit #10, bit #11, bit #12, bit #13, bit #14, bit #15} or {bit #6, bit #10, bit #12, bit #7, bit #11, bit #13, bit #14, bit #15}. In addition, the input sequence mapper 311 may map the frozen bits to the remaining bits #0, #1, #2, #3, #4, #5, #8, and #9 within the mother coded bits. The value of the frozen bit may be zero. In this case, the bits #0, #1, #2, #3, #4, #5, #8, and #9 within the mother coded bits may be set to 0. The reliability may be referred to as W(Q), and Q may refer to the bit index. The bit sequence arranged based on the reliability may be as shown in Table 3 below. The bit indices in Table 3 may correspond to the bit indices in Table 1.

TABLE 3

| Arranged bit sequence | | | | | | | | | | | | | | | |
|---|---|---|---|---|---|---|---|---|---|---|---|---|---|---|---|
| 0 | 1 | 2 | 4 | 8 | 3 | 5 | 9 | 6 | 10 | 12 | 7 | 11 | 13 | 14 | 15 |

The output of the input sequence mapper 311 may be the arranged bit sequence (e.g., the arranged bit sequence shown in Table 3). The arranged bit sequence may be delivered to the polar encoder 312. The polar encoder 312 may perform an encoding operation on the arranged bit sequence. For example, the encoding operation in the polar encoder 312 may be performed as follows.

Figure 4:
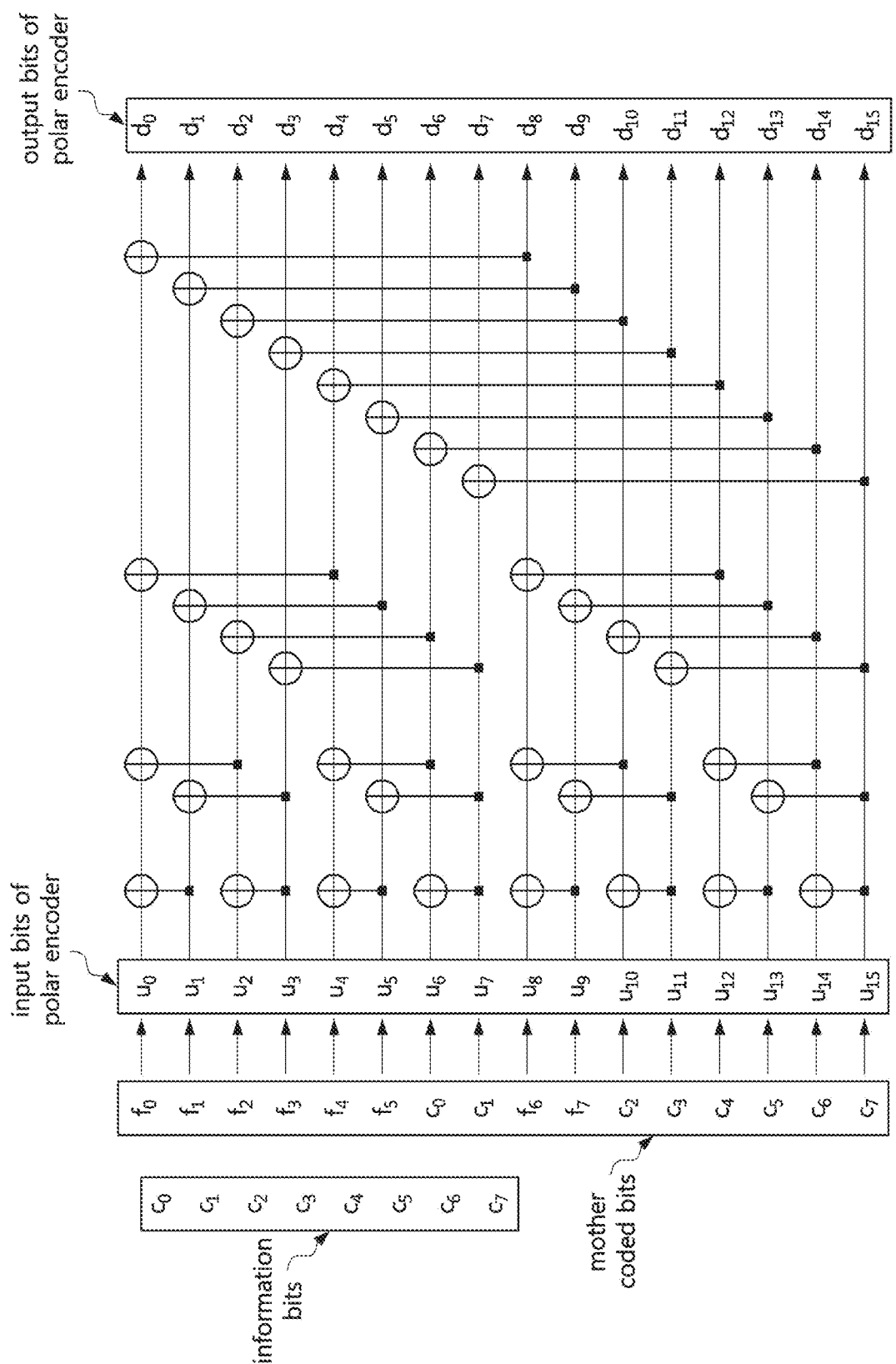
FIG. 4 is a conceptual diagram illustrating a first exemplary embodiment of an encoding operation based on a polar code in a communication system.

FIG. 4 is a conceptual diagram illustrating a first exemplary embodiment of an encoding operation based on a polar code in a communication system.

Referring to FIG. 4, information bits $c_k$ may be input bits of the input sequence mapper 311 shown in FIG. 3, and $f_m$ may be frozen bits. Here, k may be a value from 0 to 7, m may be a value from 0 to 7. Here, the value of the frozen bits $f_m$ may be set to 0. The arranged bit sequence may be the output of the input sequence mapper 311 shown in FIG. 3. $u_n$ may be generated based on the arranged bit sequence, and may be delivered to the polar encoder 312 shown in FIG. 3. $d_n$ may be the output (e.g., coded bits) of the polar encoder 312 shown in FIG. 3. Here, n may be a value from 0 to 15.

Referring again to FIG. 3, the coded bit sequence, which is the output of the polar encoder 312, may be delivered to the modulator 313. The modulator 313 may be a high order modulator. For example, the modulator 313 may perform a modulation operation on the coded bit sequence based on the M-ary quadrature amplitude modulation (QAM) scheme. Here, M may be a modulation order. For example, M may mean 16, 64, 256, 1024, 4096, or the like. In this case, the modulator 313 may perform the modulation operation on the coded bits by using a 16 QAM scheme, a 64 QAM scheme, a 256 QAM scheme, a 1024 QAM scheme, or a 4096 QAM scheme. The number m of bits (e.g., coded bits) transmitted through one modulation symbol may be log 2(M).

When the 16 QAM scheme is used, one modulation symbol d(i) may be configured in units of 4 bits (e.g., b(4i), b(4i+1), b(4i+2), b(4i+3)). In this case, the modulation symbol d(i) may be defined as Equation 2 below. The modulation symbol d(i) may be a complex symbol.

$$d(i) = \frac{1}{\sqrt{10}}\{(1-2b(4i))[2-(1-2b(4i+2))] + \quad \text{[Equation 2]}$$
$$j(1-2b(4i+1))[2-(1-2b(4i+3))]\}$$

When the 64 QAM scheme is used, one modulation symbol d(i) may be configured in units of 6 bits (e.g., b(6i), b(6i+1), b(6i+2), b(6i+3), b(6i+4), b(6i+5)). In this case, the modulation symbol d(i) may be defined as Equation 3 below.

$$d(i) = \frac{1}{\sqrt{42}} \quad \text{[Equation 3]}$$
$$\{(1-2b(6i))[4-(1-2b(6i+2))[2-(1-2b(6i+4))]] +$$
$$j(1-2b(6i+1))$$
$$[4-(1-2b(6i+3))[2-(1-2b(6i+5))]]\}$$

When the 256 QAM scheme is used, one modulation symbol d(i) may be configured in units of 8 bits (e.g., b(8i), b(8i+1), b(8i+2), b(8i+3), b(8i+4), b(8i+5), b(8i+6), b(8i+7)). In this case, the modulation symbol d(i) may be defined as in Equation 4 below.

$$d(i) = \frac{1}{\sqrt{170}}\{(1-2b(8i))[8-(1-2b(8i+2)) \quad \text{[Equation 4]}$$
$$[4-(1-2b(8i+4))[2-(1-2b(8i+6))]]] +$$
$$j(1-2b(8i+1))[8-(1-2b(8i+3))$$
$$[4-(1-2b(8i+5))[2-(1-2b(8i+7))]]]\}$$

When the high-order M-ary QAM scheme is used, modulation symbol $x(k)=x_I(k)+jx_Q(k)$ for the input bit sequence $(b_0, b_1, b_2, b_3, b_4, b_5, b_6, \ldots, b_{m-1})$ may be defined as in Equation 5 below.

$$x_I(k) = \left[\left(2^{\frac{m}{2}-1} - 2^{\frac{m}{2}} \cdot b_0\right) + \sum_{k=1}^{m/2-1}\left[\left(2^{\frac{m}{2}-k-1} - 2^{(\frac{m}{2}-k)} \cdot b_{2k}\right) \cdot \prod_{p=0}^{k-1}(2b_{2p}-1)\right]\right] \cdot d, \quad \text{[Equation 5]}$$

-continued $$x_Q(k) = \left[\left(2^{\frac{m}{2}-1} - 2^{\frac{m}{2}} \cdot b_1\right) + \sum_{k=1}^{m/2-1}\left[\left(2^{\frac{m}{2}-k-1} - 2^{(\frac{m}{2}-k)} \cdot b_{2k+1}\right) \cdot \prod_{p=0}^{k-1}(2b_{2p+1}-1)\right]\right] \cdot d$$

Here, $$d = 1 \Big/ \sqrt{\frac{2 \cdot 2^{m/2-1} \cdot \sum_{k=0}^{2^{m/2-1}}(2k+1)^2}{2^{m-2}}}$$

$$= 1 \Big/ \sqrt{\frac{\sum_{k=0}^{2^{m/2-1}-1}(2k+1)^2}{2^{m/2-2}}},$$

$$m = \log 2(M)$$

Meanwhile, the transmitting node 310 may transmit a signal composed of the modulation symbols. The receiving node 320 may receive the signal from the transmitting node 310. The received signal (e.g., received symbols) may be delivered to the demodulator 323. The demodulator 323 may perform a demodulation operation on the received symbols. An output of the demodulator 323 may be log likelihood ratio (LLR) values (e.g., soft bits), and the LLR values may be delivered to the polar decoder 322. The polar decoder 322 may generate a bit sequence by performing a decoding operation on the LLR values. In the decoding step, reliability (e.g., reliability described in Table 2) may be considered. In this case, the output of the polar decoder 322 may be a bit string including information bits (e.g., bit sequence not arranged according to reliability in the procedure for processing the transmission signal). The output (e.g., bit sequence) of the polar decoder 322 may be delivered to the information extractor 321. The information extractor 321 may extract information bits (e.g., data) from the bit sequence.

Figure 5:
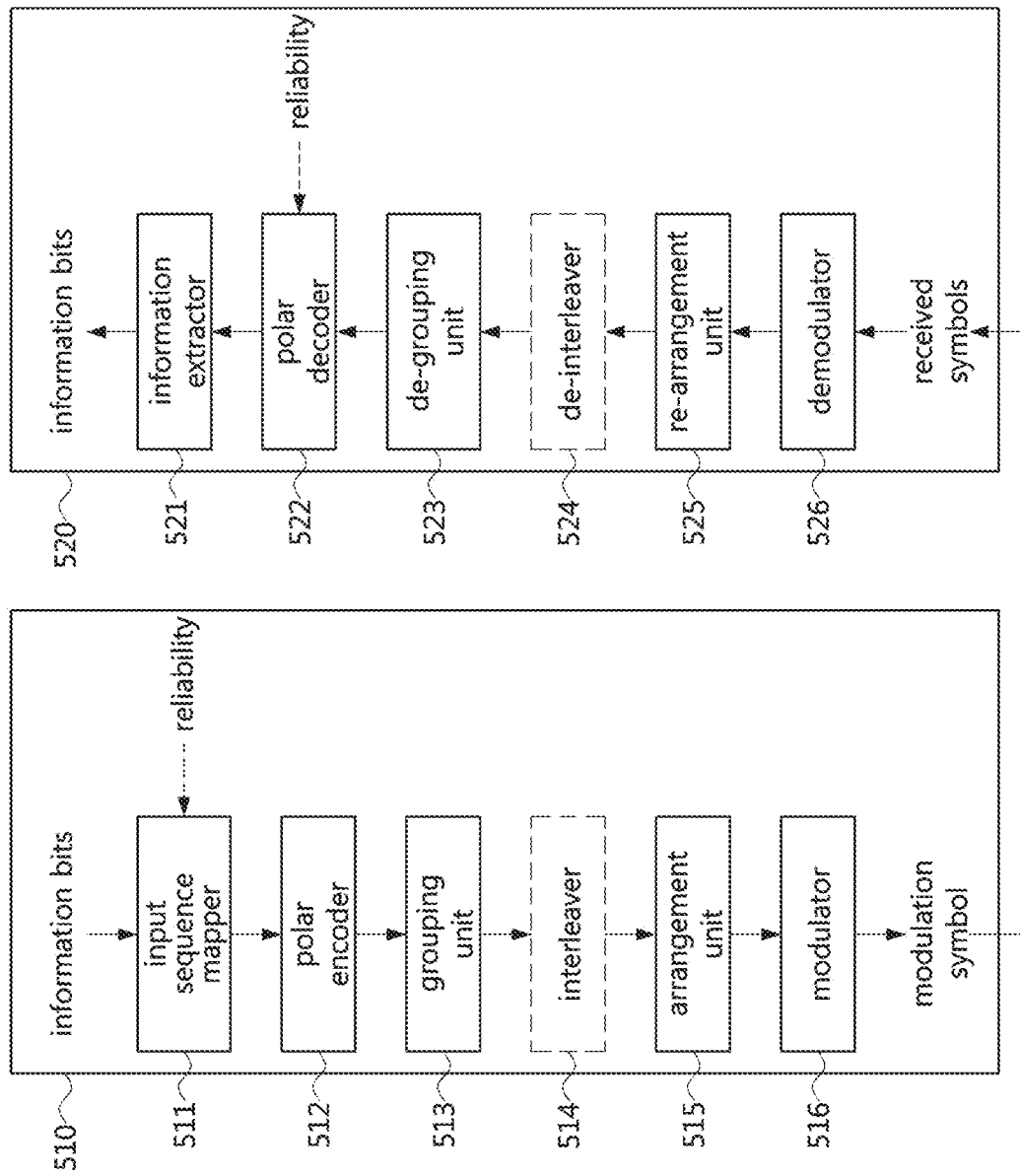
FIG. 5 is a conceptual diagram illustrating a second exemplary embodiment of a method of transmitting and receiving a signal based on a polar code in a communication system.

FIG. 5 is a conceptual diagram illustrating a second exemplary embodiment of a method of transmitting and receiving a signal based on a polar code in a communication system.

Referring to FIG. 5, a communication system may include a transmitting node 510 and a receiving node 520. Each of the transmitting node 510 and the receiving node 520 may be a base station (e.g., base station 110-1, 110-2, 110-3, 120-1, or 120-2 shown in FIG. 1) or a terminal (e.g., terminal 130-1, 130-2, 130-3, 130-4, 130-5, or 130-6 shown in FIG. 1). When the transmitting node 510 is a base station, the receiving node 520 may be a terminal. Alternatively, when the transmitting node 510 is a terminal, the receiving node 520 may be a base station or another terminal. Each of the transmitting node 510 and the receiving node 520 may be configured to be the same as or similar to the communication node 200 shown in FIG. 2.

The transmitting node 510 may include an input sequence mapper 511, a polar encoder 512, a grouping unit 513, an interleaver 514, an arrangement unit 515, and a modulator 516. The interleaver 514 may not be included in the transmitting node 510. The operation(s) of each of the input sequence mapper 511, polar encoder 512, grouping unit 513, interleaver 514, arrangement unit 515, and modulator 516 may be performed on the processor 210 shown in FIG. 2. The processor 210 may perform the operation(s) of each of the input sequence mapper 511, polar encoder 512, grouping unit 513, interleaver 514, arrangement unit 515, and modulator 516 by executing the instruction(s) stored in the memory 220 shown in FIG. 2. The function of each of the input sequence mapper 511, the polar encoder 512, and the modulator 516 may be the same as or similar to those of the input sequence mapper 311, the polar encoder 312, and the modulator 313 shown in FIG. 3.

The receiving node 520 may include an information extractor 521, a polar decoder 522, a de-grouping unit 523, a de-interleaver 524, a re-arrangement unit 525, and a demodulator 526. The de-interleaver 524 may not be included in the receiving node 520. The operation(s) of each of the information extractor 521, the polar decoder 522, the de-grouping unit 523, the de-interleaver 524, the re-arrangement unit 525, and the demodulator 526 may be performed on the processor 210 shown in FIG. 2. The processor 210 may perform the operation(s) of each of the information extractor 521, the polar decoder 522, the de-grouping unit 523, the de-interleaver 524, the re-arrangement unit 525, and the demodulator 526. The function of each of the information extractor 521, polar decoder 522, and demodulator 526 are the same as or similar to those of the information extractor 321, polar decoder 322, and demodulator 323 shown in FIG. 3.

In a procedure for processing a transmission signal performed by the transmitting node 510, the length of the mother coded bits may be N, and the length of the coded bits that are the output of the polar encoder 512 may be N. The modulator 516 may perform a modulation operation based on the M-ary QAM scheme. When the input of the modulator 516 is N bits, the output of the modulator 516 may be B/m modulation symbols. m may be the number of bits constituting one modulation symbol. Here, 'm=log 2(M)' may be defined, and M may be a modulation order. Also, 'B=Ceil(N/m)×m' may be defined. When B is different from N, (B−N) bits (e.g., dummy bits) may be added to the coded bits that are output of the polar encoder 512. The index of the dummy bit within the coded bits coded bit string or coded bit sequence) may be set to N, N+1, . . . , and n+(B−N)−1.

The output bits of the input sequence mapper 511 may be delivered to the polar encoder 512. The input sequence mapper 511 may operate identically or similarly to the input sequence mapper 311 shown in FIG. 3. For example, the input sequence mapper 511 may perform a mapping operation on information bits in consideration of reliability (e.g., channel reliability). The polar encoder 512 may generate coded bits by performing an encoding operation on the input bits.

The coded bits that are the output of the polar encoder 512 may be delivered to the grouping unit 513. The grouping unit 513 may group the coded bits into one or more groups. Here, the number G of the groups may be determined according to the number m of bits allocated to one modulation symbol. 'G=m/2' may be defined. The grouping unit 513 may perform the grouping operation according to an order of indices of the coded bits. The indices of coded bits belonging to one group may be consecutive.

The interleaving operation may be selectively performed. When the interleaving operation is performed, the output of the grouping unit 513 may be delivered to the interleaver 514. The interleaver 514 may perform a group-level interleaving operation or a bit-level interleaving operation. When a bit-level interleaving operation is performed, the interleaving operation may be performed for bits in each group. The output of the interleaver 514 may be delivered to the arrangement unit 515. Alternatively, when the interleaving operation is not performed, the output of the grouping unit 513 may be delivered to the arrangement unit 515 without performing the interleaving operation.

The arrangement unit 515 may arrange the bits (e.g., coded bits) belonging to each group based on the indices of the bits. For example, when a first group and a second group are formed by the grouping unit 513, the arrangement unit 515 may compare indices of bits belonging to the first group and indices of bits belonging to the second group. When the indices of the bits belonging to the first group are greater than the indices of the bits belonging to the second group, the arrangement unit 515 may configure the bit(s) belonging to the first group as higher bit(s) of bits constituting each modulation symbol, and the bit(s) belonging to the second group as lower bit(s) of the bits constituting each modulation symbol. That is, a bit having a higher index may be configured as a higher bit constituting each modulation symbol, and a bit having a lower index may be configured as a lower bit constituting each modulation symbol. For example, the higher bit(s) may be a most significant bit (MSB) and/or bit(s) adjacent to the MSB. The lower bit(s) may be a least significant bit (LSB) and/or bit(s) adjacent to the LSB.

The above-described grouping operation (e.g., the operation performed by the grouping unit 513) may be performed as shown in Table 4 below. B may be the number of bits input to the modulator 516, G may be the number of groups generated by the grouping unit 513, g may be the number of bits belonging to each group.

TABLE 4

$B = m * \lceil N/m \rceil$
$G = m/2$
$g = B / G$
for k = 0 to G−1
    for kk = 0 to g−1
        $c_k{^*}_{g + kk} = b_{(G - k - 1)}{^*}_{g + kk}$
    end for
end for The arrangement operation of the bit(s) belonging to the group(s) (e.g., the operation performed by the arrangement unit 515) may be performed as shown in Table 5 below.

TABLE 5 for k = 0 to g/2 − 1
    for kk = 0 to groups − 1
        $e_k{^*}_{G{^*}_2 + kk{^*}_2} = c_k{^*}_{2 + kk}{^*}_g$
        $e_k{^*}_{G{^*}_2 + kk{^*}_2 + 1} = c_k{^*}_{2 + kk}{^*}_{g + 1}$
    end for
end for The output bits of the arrangement unit 515 may be delivered to the modulator 516. The modulator 516 may generate modulation symbols by performing a modulation operation on the bits based on the M-ary QAM scheme. The transmitting node 510 may transmit a signal composed of the modulation symbols to the receiving node 520.

The receiving node 520 may receive the signal from the transmitting node 510. The received signal (e.g., received symbols) may be delivered to the demodulator 526. The demodulator 526 may generate values (e.g., soft bits) by performing a demodulation operation on the received symbols. The output of demodulator 526 (e.g., LLR, soft bits) may be delivered to the re-arrangement unit 525. The re-arrangement unit 525 may reversely perform the above-described arrangement operation (e.g., the operation performed by the arrangement unit 515, the operation shown in Table 5). For example, the re-arrangement unit 525 may perform a re-arrangement operation on the LLR values (e.g., soft bits) obtained from the demodulator 526.

When the interleaving operation is performed in the procedure for processing the transmission signal, a de-interleaving operation may be performed in the procedure for processing the received signal. In this case, the output of the re-arrangement unit 525 may be delivered to the de-interleaver 524. The de-interleaver 524 may perform a group-level de-interleaving operation or a bit-level de-interleaving operation. Here, the de-interleaving operation on the LLR sequence (e.g., soft bits) may be performed. The output of the de-interleaver 524 may be delivered to the de-grouping unit 523. Alternatively, when the interleaving operation is not performed in the procedure for processing the transmission signal, the output of the re-arrangement unit 525 may be delivered to the de-grouping unit 523 without performing the de-interleaving operation.

The de-grouping unit 523 may reversely perform the above-described grouping operation (e.g., the operation performed by the grouping unit 513, the operation shown in Table 4). For example, the de-grouping unit 523 may perform a de-grouping operation on the LLR sequence (e.g., soft bits) obtained from the de-interleaver 524 or the re-arrangement unit 525. The output of the de-grouping unit 523 may be delivered to the polar decoder 522.

The polar decoder 522 may generate a bit sequence by performing a decoding operation on the LLR sequence (e.g., soft bits). In the decoding step, reliability (e.g., reliability described in Table 2) may be considered. In this case, the output of the polar decoder 522 may be a bit sequence including information bits (e.g., the bit sequence not arranged by reliability in the procedure for processing the transmission signal). The output of the polar decoder 522 (e.g., bit sequence) may be delivered to the information extractor 521. The information extractor 521 may extract information bits (e.g., data) from the bit sequence.

Figure 6:
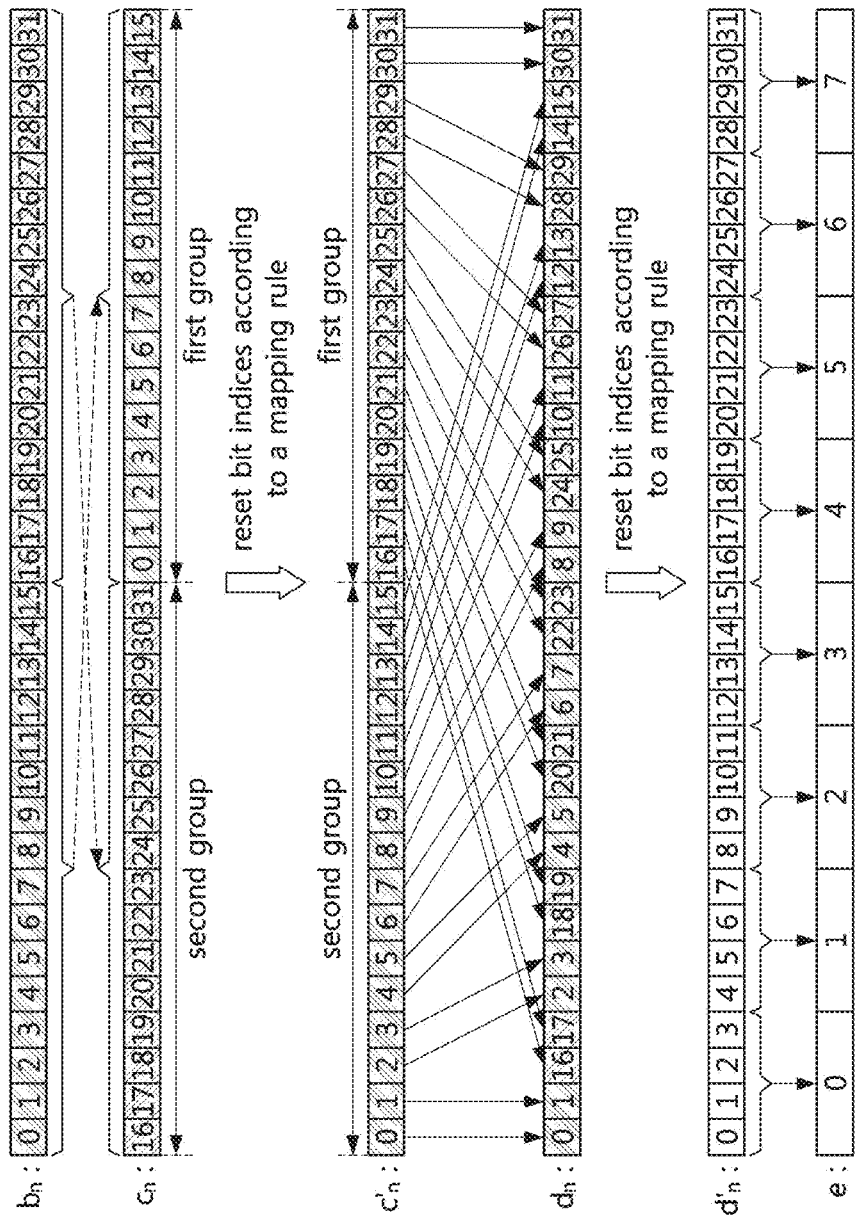
FIG. 6 is a conceptual diagram showing a first exemplary embodiment of a procedure for processing a transmission signal based on a polar code in a communication system.

FIG. 6 is a conceptual diagram showing a first exemplary embodiment of a procedure for processing a transmission signal based on a polar code in a communication system.

Referring to FIG. 6, the procedure for processing a transmission signal may be performed by the transmitting node 510 shown in FIG. 5. The length N of the coded bits that are the output of the polar encoder 512 may be 32, and the modulator 516 may perform a modulation operation based on the 16 QAM scheme. $b_n$ may be output bits (e.g., coded bits) of the polar encoder 512. n may be a value from 0 to 31. The grouping unit 513 may group $b_n$ into two groups. The coded bits #0 to #15 may be grouped into a first group, and the coded bits #16 to #31 may be grouped into a second group. Further, the grouping unit 513 may change the positions of the first group (bits #0 to #15) and the second group (bits #16 to #31). $c_n$ may be the output of the grouping unit 513. When the interleaving operation is not performed, the indices of the bits (bits #0 to #15) belonging to the first group may be reset according to a mapping rule (e.g., mapping pattern or mapping relationship) of Table 6 below, and the indices of the bits (bits #16 to #31) belonging to the second group may be reset according to a mapping rule of Table 7 below.

TABLE 6

| $c_n$ | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
|  | ↓ | ↓ | ↓ | ↓ | ↓ | ↓ | ↓ | ↓ | ↓ | ↓ | ↓ | ↓ | ↓ | ↓ | ↓ | ↓ |
| $c'_n$ | 16 | 17 | 18 | 19 | 20 | 21 | 22 | 23 | 24 | 25 | 26 | 27 | 28 | 29 | 30 | 31 |

TABLE 7

| $c_n$ | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
|  | ↓ | ↓ | ↓ | ↓ | ↓ | ↓ | ↓ | ↓ | ↓ | ↓ | ↓ | ↓ | ↓ | ↓ | ↓ | ↓ |
| $c'_n$ | 0 | 1 | 2 | 3 | 4 | 5 | 6 | 7 | 8 | 9 | 10 | 11 | 12 | 13 | 14 | 15 |

When the interleaving operation is performed, the indices of the bits (bits #0 to #15) belonging to the interleaved first group may be reset identically or similarly to the mapping rule shown in Table 6, and the indices of the bits (bits #16 to #31) belonging to the interleaved second group may be reset identically or similarly to the mapping rule shown in Table 7.

$c'_n$ may be a bit sequence composed of bits having the indices reset according to the mapping rule. $c'_n$ may be an put of the arrangement unit 515. The arrangement unit 515 may compare the indices (i.e., #16 to #31) of the bits belonging to the first group and the indices (i.e., #0 to #15) of the bits belonging to the second group. Since the indices #16 to #31) of the bits belonging to the first group are larger than the indices #0 to #15) of the bits belonging to the second group, the arrangement unit 515 may configure the bits (i.e., bits #16 to #31) belonging to the first group as higher bits constituting each modulation symbol. When the 16 QAM scheme is used, each modulation symbol may be composed of 4 bits. Therefore, each modulation symbol may have two lower bits and two higher bits. For example, each modulation symbol may be configured as follows.

Figure 7:
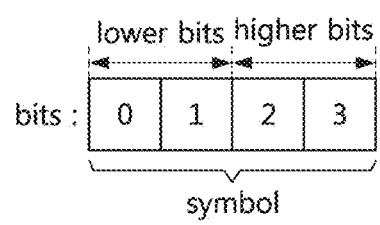
FIG. 7 is a conceptual diagram illustrating a first structure of a symbol composed of 4 bits when a 16 QAM scheme is used.

FIG. 7 is a conceptual diagram illustrating a first structure of a symbol composed of 4 bits when a 16 QAM scheme is used.

Referring to FIG. 7, 4 bits may be mapped to one symbol. When one symbol consists of bits #0, #1, #2, and #3, the bits #2 and #3 may be higher bits, and bits #0 and #1 may be lower bits.

Referring again to FIG. 6, the bits (i.e., bits #16 to #31) belonging to the first group may be configured as the higher bits of each modulation symbol in units of 2 bits. Also, the arrangement wilt 515 may configure the bits (i.e., bits #0 to #15) belonging to the second group as the lower bits constituting each modulation symbol. That is, the bits (i.e., bits #0 to #15) belonging to the second group may be configured as the lower bits of each modulation symbol in units of 2 bits.

$d_n$ may be output bits of the arrangement unit 515. The indices of the output bits of the arrangement unit 515 may be rearranged sequentially. For example, {0, 1, 16, 17, 2, 3, 18, 19, 4, 5, 20, 21, 6, 7, 22, 23, 8, 9, 24, 25, 10, 11, 26, 27, 12, 13, 28, 29, 14, 15, 30, 31}, which are the indices of the output bits of the arrangement unit 515, may be rearranged to {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}. Here, $d'_n$ may be a bit sequence composed of the bits having the rearranged indices. $d'_n$ may be delivered to the modulator 516.

The modulator 516 may generate modulation symbols $e_0$, $e_1$, $e_2$, $e_3$, $e_4$, $e_5$, $e_6$, and $e_7$ by performing a modulation operation on $d'_n$ based on the 16 QAM scheme. The transmitting node 510 may transmit a signal including the modulation symbols $e_0$, $e_1$, $e_2$, $e_3$, $e_4$, $e_5$, $e_6$, and $e_7$ to the receiving node 520. The receiving node 520 may receive the signal from the transmitting node 510, and perform signal processing operations (e.g., demodulation operation, re-arrangement operation, de-interleaving operation (optional), de-grouping operation, decoding operation, and information extraction operation) in the reverse order of the above-described operations.

For example, the demodulator 526 included in the receiving node 520 may obtain LLR values by performing a demodulation operation on the received symbols. The LLR value may be an LLR value for each of the bits constituting the received symbol. The re-arrangement unit 525 included in the receiving node 520 may place the LLR value for each of the higher bits of the received symbol in a first group, and the UR value for each of the lower bits of the received symbol in a second group. When the interleaving operation is performed in the procedure for processing the transmission signal, the de-interleaver 524 included in the receiving node 520 may perform de-interleaving operations for the first group and the second group.

When the re-arrangement operation or the de-interleaving operation is completed, the de-grouping unit 523 included in the receiving node 520 may perform de-grouping operations for the first group and the second group. In this case, the arrangement positions of the groups may be changed. The polar decoder 522 included in the receiving node 520 may obtain a bit sequence by performing a decoding operation on the output (e.g., LLR sequence for bits) of the de-grouping unit 523. The decoding operation may be performed in consideration of reliability (e.g., channel reliability). In this case, the output bit sequence of the polar decoder 522 may be the bit sequence not arranged according to reliability. The information extractor 521 included in the receiving node 520 may obtain the information bits from the output bit sequence of the polar decoder 522.

Figure 8:
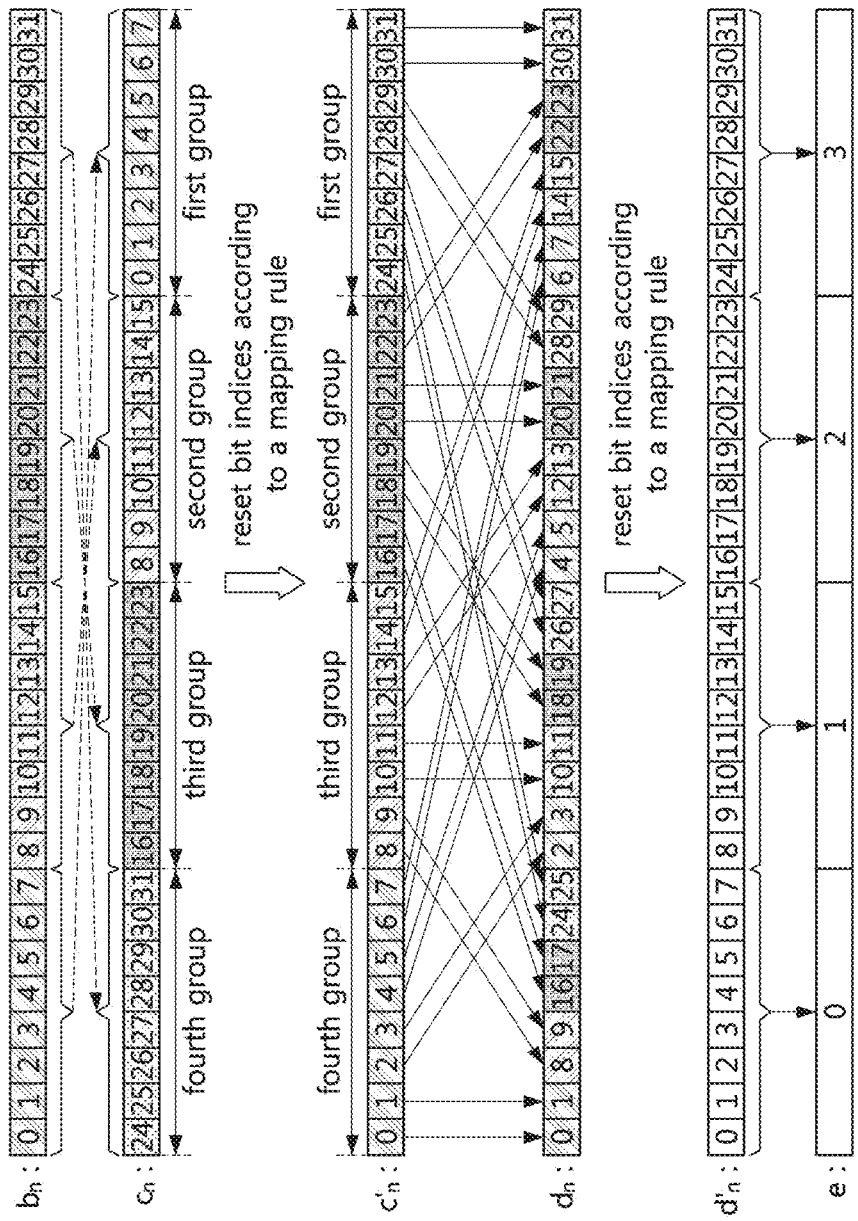
FIG. 8 is a conceptual diagram illustrating a second exemplary embodiment of a procedure for processing a transmission signal based on a polar code in a communication system.

FIG. 8 is a conceptual diagram illustrating a second exemplary embodiment of a procedure for processing a transmission signal based on a polar code in a communication system.

Referring to FIG. 8, the procedure for processing a transmission signal may be performed by the transmission node 510 shown in FIG. 5. The length N of the coded bits that are the output of the polar encoder 512 may be 32, and the modulator 516 may perform a modulation operation based on the 256 QAM scheme. $b_n$ may be output bits (e.g., coded bits) of the polar encoder 512. n may be a value from 0 to 31. The grouping unit 513 may group $b_n$ into four groups. The bits #0 to #7 may be grouped into the first group, the bits #8 to #15 may be grouped into the second group, the bits #16 to #23 may be grouped into the third group, and the bits #24 to #31 may be grouped into the fourth group. Also, the grouping unit 513 may change the positions of the groups. $c_n$ may be the output of the grouping unit 513. When the interleaving operation is not performed, the indices of the bits (i.e., bits #0 to #7) belonging to the first group may be reset according to a mapping rule (i.e., mapping pattern or mapping relationship) of Table 8 below, the indices of the bits (i.e., bits #8 to #15) belonging to the second group may be reset according to a mapping rule of Table 9 below, the indices of the bits (i.e., bits #16 to #23) belonging to the third group may be reset according to a mapping rule of Table 10 below, and the indices of the bits (i.e., bits #24 to #31) belonging to the fourth group may be reset according to a mapping rule of Table 11 below.

TABLE 8

| $c_n$ | 0 | 1 | 2 | 3 | 4 | 5 | 6 | 7 |
|---|---|---|---|---|---|---|---|---|
| | ↓ | ↓ | ↓ | ↓ | ↓ | ↓ | ↓ | ↓ |
| $c'_n$ | 24 | 25 | 26 | 27 | 28 | 29 | 30 | 31 |

TABLE 9

| $c_n$ | 8 | 9 | 10 | 11 | 12 | 13 | 14 | 15 |
|---|---|---|---|---|---|---|---|---|
| | ↓ | ↓ | ↓ | ↓ | ↓ | ↓ | ↓ | ↓ |
| $c'_n$ | 16 | 17 | 18 | 19 | 20 | 21 | 22 | 23 |

TABLE 10

| $c_n$ | 16 | 17 | 18 | 19 | 20 | 21 | 22 | 23 |
|---|---|---|---|---|---|---|---|---|
| | ↓ | ↓ | ↓ | ↓ | ↓ | ↓ | ↓ | ↓ |
| $c'_n$ | 8 | 9 | 10 | 11 | 12 | 13 | 14 | 15 |

TABLE 11

| $c_n$ | 24 | 25 | 26 | 27 | 28 | 29 | 30 | 31 |
|---|---|---|---|---|---|---|---|---|
| | ↓ | ↓ | ↓ | ↓ | ↓ | ↓ | ↓ | ↓ |
| $c'_n$ | 0 | 1 | 2 | 3 | 4 | 5 | 6 | 7 |

When the interleaving operation is performed, the indices of the bits (i.e., bits #0 to #7) belonging to the interleaved first group may be reset identically or similarly to the mapping rule shown in Table 8, the indices of the bits (i.e., bits #8 to #15) belonging to the interleaved second group may be reset identically or similarly to the mapping rule shown in Table 9, the bits (i.e., bits #16 to #23) belonging to the interleaved third group may be reset identically or similarly to the mapping rule shown in Table 10, and the indices of the bits (i.e., bits #24 to bit #31) belonging to the interleaved fourth group may be reset identically or similarly to the mapping rule shown in Table 11.

$c'_n$ may be a bit sequence composed of bits having the indices reset according to a mapping rule. $c'_n$ may be an put of the arrangement unit 515. The arrangement unit 515 may compare the indices (i.e., #24 to #31) of the bits belonging to the first group, the indices (i.e., #16 to #23) of the bits belonging to the second group, the indices (i.e., #8 to #15) of the bits belonging to the third group, and the indices (i.e., #0 to #7) of the bits belonging to the fourth group. The arrangement unit 515 may configure the bits belonging to each group as bits constituting each modulation symbol based on the result of the comparison between the indices of the groups. When the 256 QAM scheme is used, each symbol (e.g., modulation symbol) may be composed of 8 bits. Therefore, each symbol may comprise two least significant bits (lowest bits), two lower bits, two higher bits, and two most significant bits (highest bits). For example, each modulation symbol may be configured as follows.

Figure 9:
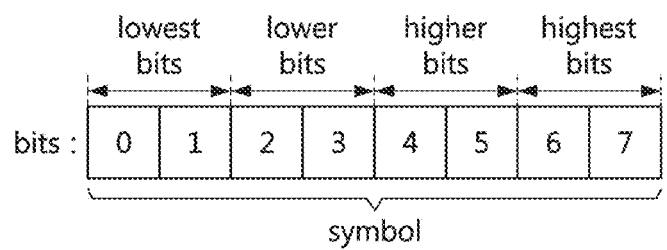
FIG. 9 is a conceptual diagram showing a first structure of a symbol composed of 8 bits when a 256 QAM scheme is used.

FIG. 9 is a conceptual diagram showing a first structure of a symbol composed of 8 bits when a 256 QAM scheme is used.

Referring to FIG. 9, 8 bits may be mapped to one symbol. When one symbol consists of bits #0, #1, #2, #3, #4, #5, #6, and #7, the bits #6 and #7 may be the most significant bits, the bits #4 and #5 may be the higher bits, the bits #2 and #3 may be the lower bits, and the bits #0 and #1 may be the least significant bits.

Referring again to FIG. 8, since the indices (i.e., #24 to #31) of the bits belonging to the first group are the largest among the four groups, the arrangement unit 515 may configure the bits (i.e., bits #24 to #31) belonging to the first group as the most significant bits constituting each modulation symbol. Since the indices (i.e., #16 to #23) of the bits belonging to the second group are the largest among the three groups excluding the first group, the arrangement unit 515 may configured the bits (i.e., bits #16 to #23) belonging to the second group as the higher bits constituting each modulation symbol. Since the indices (i.e., #8 to #15) of the bits belonging to the third group are the largest among the two groups except the first group and the second group, the arrangement unit 515 may configure the bits (i.e., bits #8 to #15) belonging to the third group as the lower bits constituting each modulation symbol. Since the indices (i.e., #0 to #7) of the bits belonging to the fourth group are the smallest among the four groups, the arrangement unit 515 may configure the bits (i.e., bits #0 to #7) belonging to the fourth group as the least significant bits constituting each modulation symbol.

$d_n$ may be output bits of the arrangement unit 515. The indices of the output bits of the arrangement unit 515 may be rearranged sequentially. For example, the indices {0, 1, 8, 9, 16, 17, 24, 25, 2, 3, 10, 11, 18, 19, 26, 27, 4, 5, 12, 13, 20, 21, 23, 29, 6, 7, 14, 15, 22, 23, 30, 31}, which are indices of the output bits of the arrangement unit 515, may be rearranged to {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}. Here, $d'_n$ may be a bit sequence composed of the bits having the rearranged indices. $d'_n$ may be delivered to the modulator 516.

The modulator 516 may generate modulation symbols $e_0$, $e_1$, $e_2$, and $e_3$ by performing a modulation operation on $d'_n$ based on the 256 QAM scheme. The transmitting node 510 may transmit a signal including the modulation symbols $e_0$, $e_1$, $e_2$, and $e_3$ to the receiving node 520. The receiving node 520 may receive the signal from the transmitting node 510, and perform signal processing operations (e.g., demodulation operation, re-arrangement operation, de-interleaving operation (optional), de-grouping operation, decoding operation, information extraction operation) in the reverse order of the above-described operations.

For example, the demodulator 526 included in the receiving node 520 may obtain LLR values by performing a demodulation operation on the received symbols. The LLR value may be an LLR for each of the bits constituting the received symbol. The re-arrangement unit 525 included in the receiving node 520 may place the LLR value for each of the most significant bits of the received symbol in a first group, the LLR value for each of the higher bits of the received symbol in a second group, the LLR value for each of the lower bits of the received symbol in a third group, and the LLR value for each of the least significant bits of the received symbol in a fourth group. When the interleaving operation is performed in the procedure for processing the transmission signal, the de-interleaver 524 included in the receiving node 520 may perform dc-interleaving operations for the first group, the second group, the third group, and the fourth group.

When the re-arrangement operation or the de-interleaving operation is completed, the de-grouping unit 523 included in the receiving node 520 may perform a de-grouping operation for the first group, the second group, the third group, and the fourth group. In this case, the arrangement positions of the groups may be changed. The polar decoder 522 included in the receiving node 520 may obtain a bit sequence by performing a decoding operation on the output (e.g., LLR sequence for bits) of the de-grouping unit 523. The decoding operation may be performed in consideration of reliability (e.g., channel reliability). In this case, the output bit sequence of the polar decoder 522 may be the bit sequence not arranged according to reliability. The information extractor 521 included in the receiving node 520 may obtain information bits from the output bit sequence of the polar decoder 522.

The result of comparison between an error rate according to the method shown in FIG. 5 and an error rate according to the conventional method is as follows.

FIG. 10A is a first graph showing a bit error rate (BER) according to the method shown in FIG. 5 and a BER according to the conventional method, and FIG. 10B is a first graph showing a block error rate (BLER) according to the method shown in FIG. 5 and a BLER according to the conventional method.

Referring to FIGS. 10A and 10B, the length N of the mother coded bits, which are the input of the polar encoder 512, may be 1024, and the size K of the information bits may be 512. The modulation scheme may be the 16 QAM scheme. In the graph shown in FIG. 10A, $E_s/N_0$ according to the method shown in FIG. 5 at the BER of 1E-5 may be smaller by 0.6 dB or more, than $E_s/N_0$ according to the conventional method. $E_s/N_0$ may mean an 'energy per symbol to noise power spectral density ratio'. In the graph shown in FIG. 10B, $E_s/N_0$ according to the method shown in FIG. 5 at the BLER of 1E-4 may be smaller by 0.5 dB or more, than $E_s/N_0$ according to the conventional method. That is, according to the method illustrated in FIG. 5, the efficiency of transmission power can be improved. Here, each of BER and BLER may be BER and BLER in an additive white Gaussian noise (AWGN) environment.

Figure 11B:
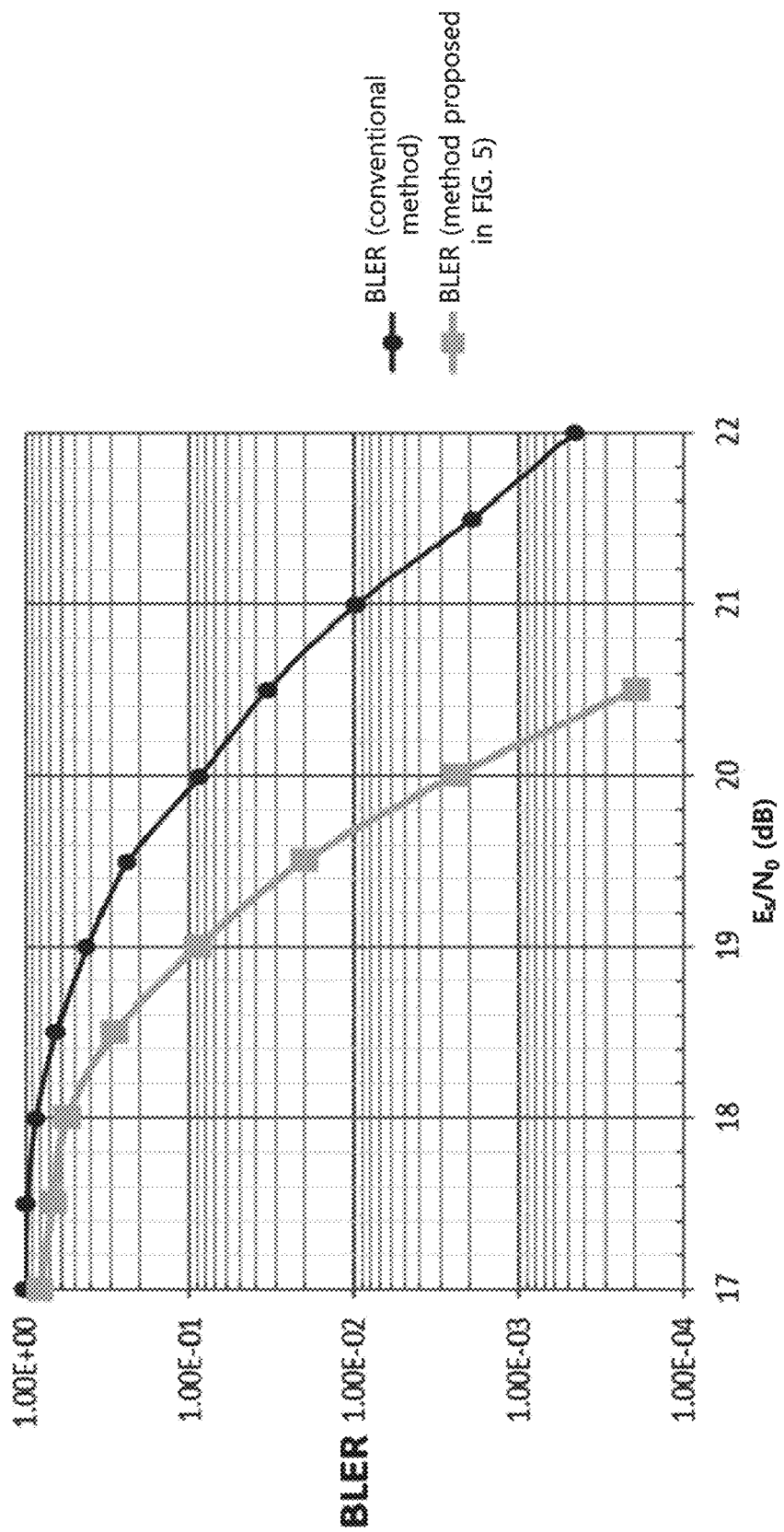
FIG. 11B is a second graph showing a BLER according to the method shown in FIG. 5 and a BLER according to the conventional method.

FIG. 11A is a second graph showing a BER according to the method shown in FIG. 5 and a BER according to the conventional method, and FIG. 11B is a second graph showing a BLER according to the method shown in FIG. 5 and a BLER according to the conventional method.

Referring to FIGS. 11A and 11B, the length N of the mother coded bits, which are the input of the polar encoder 512, may be 1024, and the size K of the information bits may be 512. The modulation scheme may be the 256 QAM scheme. In the graph shown in FIG. 11A, $E_s/N_0$ according to the method shown in FIG. 5 at the BER of 1E-4 may be smaller by 1.5 dB or more, than $E_s/N_0$ according to the conventional method. In the graph shown in FIG. 11B, $E_s/N_0$ according to the method shown in FIG. 5 at the BLER of 1E-3 may be smaller by 1.5 dB or more, than $E_s/N_0$ according to the conventional method. That is, according to the method illustrated in FIG. 5, the efficiency of transmission power can be improved. Here, each of BER and BLER may be BER and BLER in the AWGN environment.

Figure 12:
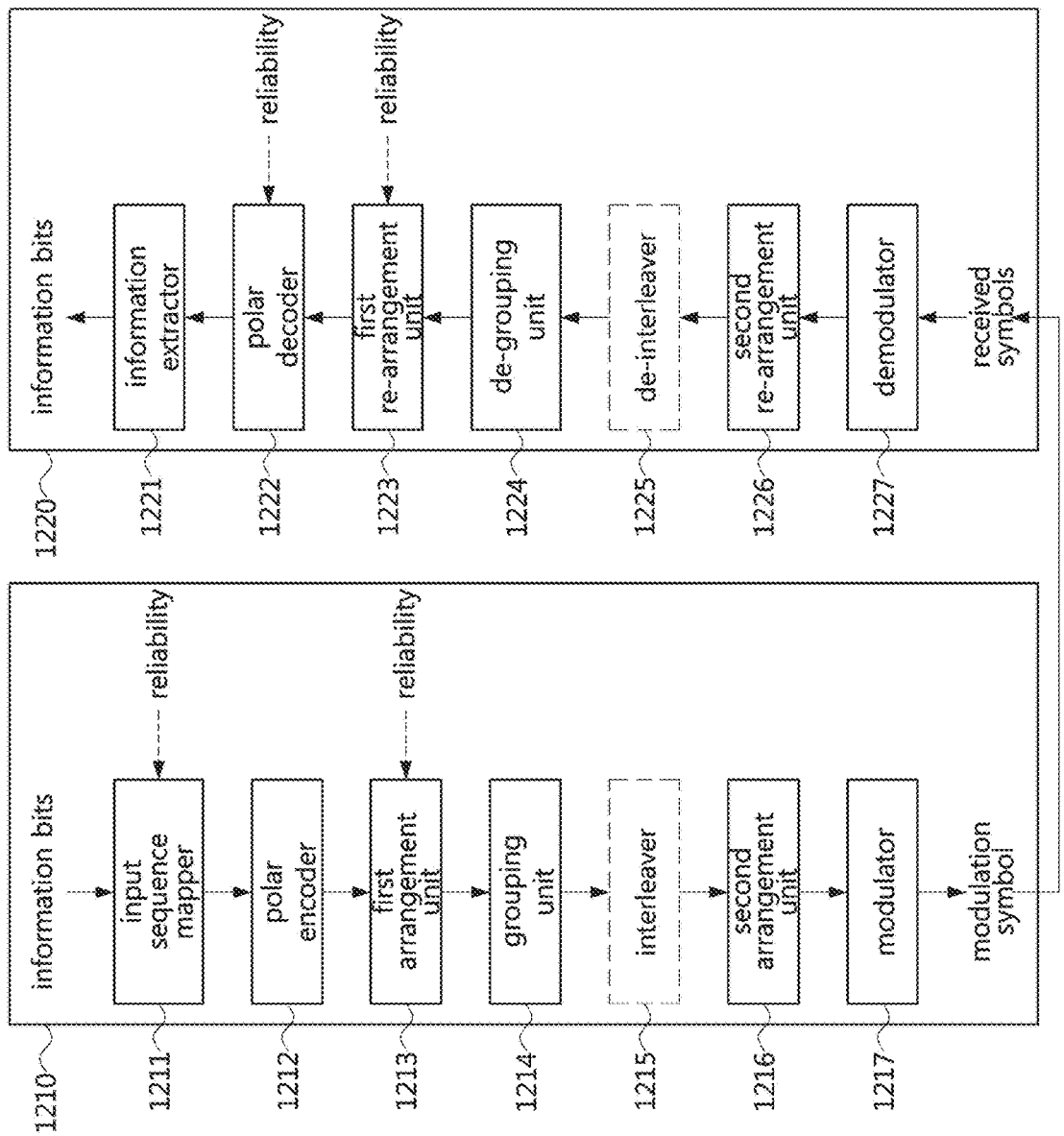
FIG. 12 is a conceptual diagram illustrating a third exemplary embodiment of a method of transmitting and receiving a signal based on a polar code in a communication system.

FIG. 12 is a conceptual diagram illustrating a third exemplary embodiment of a method of transmitting and receiving a signal based on a polar code in a communication system.

Referring to FIG. 12, a communication system may include a transmitting node 1210 and a receiving node 1220. Each of the transmitting node 1210 and the receiving node 1220 may be a base station (e.g., base station 110-1, 110-2, 110-3, 120-1, or 120-2 shown in FIG. 1) or a terminal (e.g. terminal 130-1, 130-2, 130-3, 130-4, 130-5, or 130-6 shown in FIG. 1). When the transmitting node 1210 is a base station, the receiving node 1220 may be a terminal. Alternatively, when the transmitting node 1210 is a terminal, the receiving node 1220 may be a base station or another terminal. Each of the transmitting node 1210 and the receiving node 1220 may be configured to be the same as or similar to the communication node 200 shown in FIG. 2.

The transmitting node 1210 may include an input sequence mapper 1211, a polar encoder 1212, a first arrangement unit 1213, a grouping unit 1214, an interleaver 1215, a second arrangement unit 1216, and a modulator 1217. The interleaver 1215 may not be included in the transmitting node 1210. The operation(s) of each of the input sequence mapper 1211, polar encoder 1212, first arrangement unit 1213, grouping unit 1214, interleaver 1215, second arrangement unit 1216, and modulator 1217 may be performed on the processor 210 shown in FIG. 2. The processor 210 may perform the operation(s) of each of the input sequence mapper 1211, polar encoder 1212, first arrangement unit 1213, grouping unit 1214, interleaver 1215, second arrangement unit 1216, and modulator 1217 by executing the instruction(s) stored in the memory 220 shown in FIG. 2.

The function of the second arrangement unit 1216 may be the same as or similar to that of the arrangement unit 515 shown in FIG. 5. That is, the transmitting node 1210 shown in FIG. 12 may further include the first arrangement unit 1213 compared to the transmitting node 510 shown in FIG. 5. The first arrangement unit 1213 may be used to arrange the output bit sequence of the polar encoder 1212 according to reliability. The function of each of the input sequence mapper 1211, polar encoder 1212, grouping unit 1214, interleaver 1215, second arrangement unit 1216, and modulator 1217 may be the same as or similar to the function of each of the input sequence mapper 511, polar encoder 512, grouping unit 513, interleaver 514, arrangement unit 515, and the modulator 516 shown in FIG. 5.

The receiving node 1220 may include an information extractor 1221, a polar decoder 1222, a first re-arrangement unit 1223, a de-grouping unit 1224, a de-interleaver 1225, a second re-arrangement unit 1226, and a demodulator 1227. The de-interleaver 1225 may not be included in the receiving node 1220. The operation(s) of each of the information extractor 1221, polar decoder 1222, first re-arrangement unit 1223, de-grouping unit 1224, de-interleaver 1225, second re-arrangement unit 1226, and demodulator 1227 may be performed on the processor 210 shown in FIG. 2. The processor 210 may perform the operation(s) of each of the information extractor 1221, the polar decoder 1222, first re-arrangement unit 1223, de-grouping 1224, de-interleaver 1225, second re-arrangement unit 1226, and the demodulator 1227.

The function of the second re-arrangement unit 1226 may be the same as or similar to the function of the re-arrangement unit 525 shown in FIG. 5. That is, the receiving node 1220 illustrated in FIG. 12 may further include the first re-arrangement unit 1223 compared to the receiving node 520 illustrated in FIG. 5. The first re-arrangement unit 1223 may be used to arrange the output bit sequence of the de-grouping unit 1224 according to reliability. The function of each of the information extractor 1221, the polar decoder 1222, the de-grouping unit 1224, the de-interleaver 1225, the second re-arrangement unit 1226, and the demodulator 1227 may be the same as or similar to the functions of each of the information extractor 521, polar decoder 522, de-grouping unit 523, de-interleaver 524, re-arrangement unit 525, and demodulator 526 shown in FIG. 5.

In a procedure for processing a transmission signal performed by the transmitting node 1210, the length of the mother coded bits may be N, and the length of the coded bits that are the output of the polar encoder 1212 may be N. The modulator 1217 may perform a modulation operation based on the M-ary QAM scheme. When the input of the modulator 1217 is N bits, the output of the modulator 1217 may be B/m modulation symbols. m may be the number of bits constituting one modulation symbol. Here, 'm=log 2(M)' may be defined, and M may be a modulation order.

The output bits of the input sequence mapper 1211 may be delivered to the polar encoder 1212. The input sequence mapper 1211 may operate identically or similarly to the input sequence mapper 311 shown in FIG. 3. For example, the input sequence mapper 1211 may perform a mapping operation for information bits in consideration of reliability (e.g., channel reliability). The polar encoder 1212 may generate coded bits by performing an encoding operation on the input bits.

The output bits of the polar encoder 512 may be delivered to the first arrangement unit 1213. The first arrangement unit 1213 may arrange the bits by using the reliability (e.g., channel reliability) for the bits (e.g., the output bits of the polar encoder 1212). For example, the arrangement operation performed by the first arrangement unit 1213 may be as follows.

Figure 13:
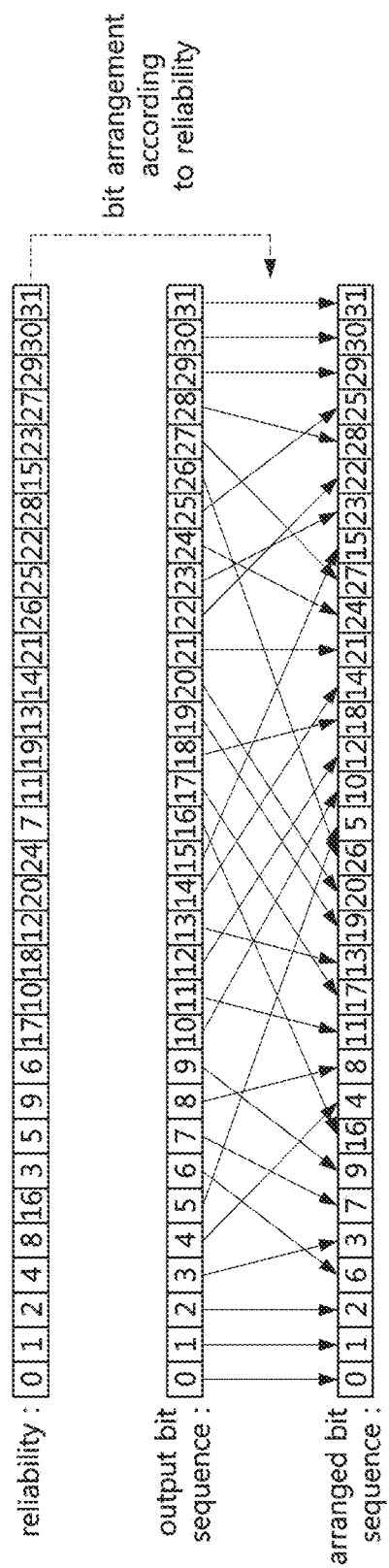
FIG. 13 is a conceptual diagram illustrating a first exemplary embodiment of a bit arrangement method in a communication system.

FIG. 13 is a conceptual diagram illustrating a first exemplary embodiment of a bit arrangement method in a communication system.

Referring to FIG. 13, the length N of the mother coded bits may be 32, and indices of the output bits (e.g., output bit sequence) of the polar encoder 1212 may be {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31}, and the reliability thereof may be {0, 1, 2, 4, 8, 16, 3, 5, 9, 6, 17, 10, 18, 12, 20, 24, 7, 11, 19, 13, 14, 21, 26, 25, 22, 15, 23, 27, 29, 30, 31}.

The first arrangement unit 1213 may generate the arranged bit sequence by arranging the bits belonging to the output bit sequence according to reliability. For example, since the reliability of the bit having the index #0 in the output bit sequence is 0, the corresponding bit (e.g., the bit having the index #0) may be arranged in the first bit within the arranged bit sequence. Since the reliability of the bit having the index #3 in the output bit sequence is 4, the corresponding bit (e.g., the bit having the index #3) may be arranged in the fifth bit within the arranged bit sequence. Since the reliability of the bit having an index #7 in the output bit sequence is 5, the corresponding bit (e.g., the bit having the index #7) may be arranged in the sixth bit within the arranged bit sequence. The above-described bit arrangement operation may be performed according to Table 12 below. $a_k$ may be the output bits of the polar encoder 1212, and $b_{Qk}$ may be the bits arranged by the first arrangement unit 1213.

TABLE 12 for k = 0 to N−1
$b_{Qk} = a_k$
end for

Referring again to FIG. 12, the output bits (e.g., arranged bits) of the first arrangement unit 1213 may be delivered to the grouping unit 1214. The grouping unit 1214 may group the bits into one or more groups. Here, the number G of groups may be determined according to the number m of bits allocated to one modulation symbol. 'G=m/2' may be defined. The grouping unit 1214 may perform a grouping operation according to the order of indices of the bit(s). The indices of coded bit(s) belonging to one group may be consecutive.

The interleaving operation may be selectively performed. When the interleaving operation is performed, the output of the grouping unit 1214 may be delivered to the interleaver 1215. The interleaver 1215 may perform a group-level interleaving operation or a bit-level interleaving operation. When the bit-level interleaving operation is performed, an interleaving operation may be performed for bits within each group. The output of the interleaver 1215 may be delivered to the second arrangement unit 1216. Alternatively, when the interleaving operation is not performed, the output of the grouping unit 1214 may be delivered to the second arrangement unit 1216 without performing the interleaving operation.

The second arrangement unit 1216 may arrange the bits based on the indices of the bits belonging to each group. For example, when the first group and the second group are generated by the grouping unit 1214, the second arrangement unit 1216 may compare the indices of the bits belonging to the first group and the indices of the bits belonging to the second group. When the indices of the bits belonging to the first group are greater than the indices of the bits belonging to the second group, the second arrangement unit 1216 may configure the bits belonging to the first group as higher bits among bits constituting each modulation symbol, and the bits belonging to the second group as lower bits among the bits constituting each modulation symbol. That is, a bit having a higher index may be configured as a higher bit constituting each modulation symbol, and a bit having a lower index may be configured as a lower bit constituting each modulation symbol.

The above-described grouping operation (e.g., operation performed by the grouping unit 1214) may be performed as shown in Table 4 above. The arrangement operation of the bits belonging to the groups (e.g., operation performed by the second arrangement unit 1216) may be performed as shown in Table 5 above.

The output bits of the second arrangement unit 1216 may be delivered to the modulator 1217. The modulator 1217 may generate modulation symbols by performing a modulation operation on the bits based on the QAM scheme. The transmitting node 1210 may transmit a signal composed of the modulation symbols to the receiving node 1220.

The receiving node 1220 may receive the signal from the transmitting node 1210. The received symbol(s) may be delivered to demodulator 1227. The demodulator 1227 may generate LLR values (e.g., soft bits) by performing a demodulation operation on the received symbol(s). The output of the demodulator 1227 (e.g., LLR values, soft bits) may be delivered to the second re-arrangement unit 1226. The second re-arrangement unit 1226 may reversely perform the above-described arrangement operation (e.g., operation performed by the second arrangement unit 1216, the operation shown in Table 5). For example, the second re-arrangement unit 1226 may perform a re-arrangement operation on the LLRs (e.g., soft bits) obtained from the demodulator 1227.

When the interleaving operation is performed in the procedure for processing the transmission signal, a de-interleaving operation may be performed in the procedure for processing the received signal. In this case, the output of the second re-arrangement unit 1226 may be delivered to the de-interleaver 1225. The de-interleaver 1225 may perform a group-level de-interleaving operation or a bit-level de-interleaving operation. Here, the de-interleaving operation on the UR sequence (e.g., soft bits) may be performed. The output of the de-interleaver 1225 may be delivered to the de-grouping unit 1224. Alternatively, when the interleaving operation is not performed in the procedure of processing the transmission signal, the output of the second re-arrangement unit 1226 may be delivered to the de-grouping unit 1224 without performing the de-interleaving operation.

The de-grouping unit 1224 may reversely perform the above-described grouping operation (e.g., the operation performed by the grouping unit 1214, the operation defined in Table 4). For example, the de-grouping unit 1224 may perform a de-grouping operation on the LLRs (e.g., soil bits) obtained from the de-interleaver 1225 or the second re-arrangement unit 1226. The output of the de-grouping unit 523 may be delivered to the first re-arrangement unit 1223. The first re-arrangement unit 1223 may reversely perform the above-described arrangement operation (e.g., the operation performed by the first arrangement unit 1213, the operation defined in Table 12). For example, the first re-arrangement unit 1223 may perform a re-arrangement operation on the LLRs (e.g., soft bits) in consideration of reliability. The output of the first re-arrangement unit 1223 may be delivered to the polar decoder 1222.

The polar decoder 1222 may generate a bit sequence by performing a decoding operation on the LLR sequence (e.g., soft bits). In the decoding step, reliability (e.g., the reliability described in Table 2) may be considered. In this case, the output of the polar decoder 1222 may be a bit sequence including information bits (e.g., the bit sequence not arranged by reliability in the procedure of processing the transmission signal). The output of the polar decoder 1222 (e.g., bit sequence) may be delivered to the information extractor 1221. The information extractor 1221 may extract information bits (e.g., data) from the bit sequence.

Meanwhile, when the length N of the output bits (e.g., coded bits) of the polar encoder 1212 is 32 and the modulator 1217 performs a modulation operation based on the 16 QAM scheme, the procedure for processing the transmission signal performed in transmitting node 1210 may be the same as or similar to the procedure for processing the transmission signal shown in FIG. 6. When the length N of the output bits (e.g., coded bits) of the polar encoder 1212 is 32 and the modulator 1217 performs a modulation operation based on the 256 QAM scheme, the procedure for processing the transmission signal performed in the transmitting node 1210 may be the same as or similar to the procedure for processing the transmission signal shown in FIG. 8.

FIG. 14A is a first graph showing a BER according to the method shown in FIG. 12 and a BER according to the conventional method, and FIG. 14B is a first graph showing a BLER according to the method shown in FIG. 12 and a BLER according to the conventional method.

Referring to FIGS. 14A and 14B, the length N of the mother coded bits that are inputs of the polar encoder 1212 may be 1024, and the size K of the information bits may be 512. The modulation scheme may be the 16 QAM scheme. In the graph shown in FIG. 14A, $E_s/N_0$ according to the method shown in FIG. 12 at the BER of 1E-5 may be smaller by 1.0 dB or more, than $E_s/N0$ according to the conventional method, and $E_s/N_0$ according to the method shown in FIG. 12 at the BER of 1E-5 may be smaller by 0.3 dB or more, than $E_s/N_0$ according to the method shown in FIG. 5. In the graph shown in FIG. 14B, $E_s/N_0$ according to the method shown in FIG. 12 at the BLER of 1E-4 may be smaller by 0.9 dB or more, than $E_s/N_0$ according to the conventional method, and $E_s/N_0$ according to the method shown in FIG. 12 at the BLER of 1E-4 may be smaller by 0.4 dB or more, than $E_s/N_0$ according to the method shown in FIG. 5. That is, according to the method shown in FIG. 12, the efficiency of transmission power can be improved. Here, each of BER and BLER may be BER and BLER in the AWGN environment.

Figure 15A:
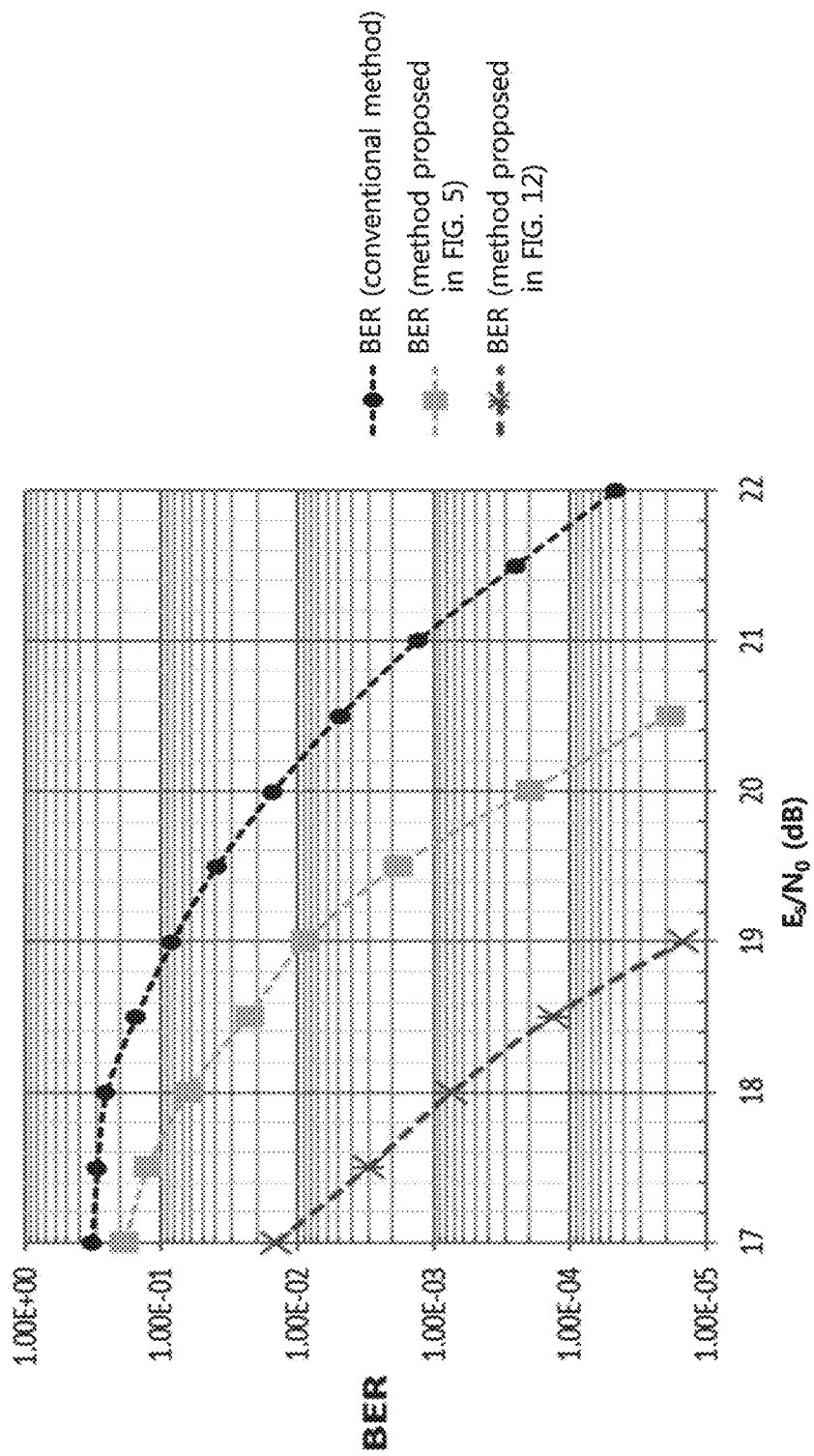
FIG. 15B is a second graph showing a BLER according to the method shown in FIG. 12 and a BLER according to the conventional method.
Figure 15B:
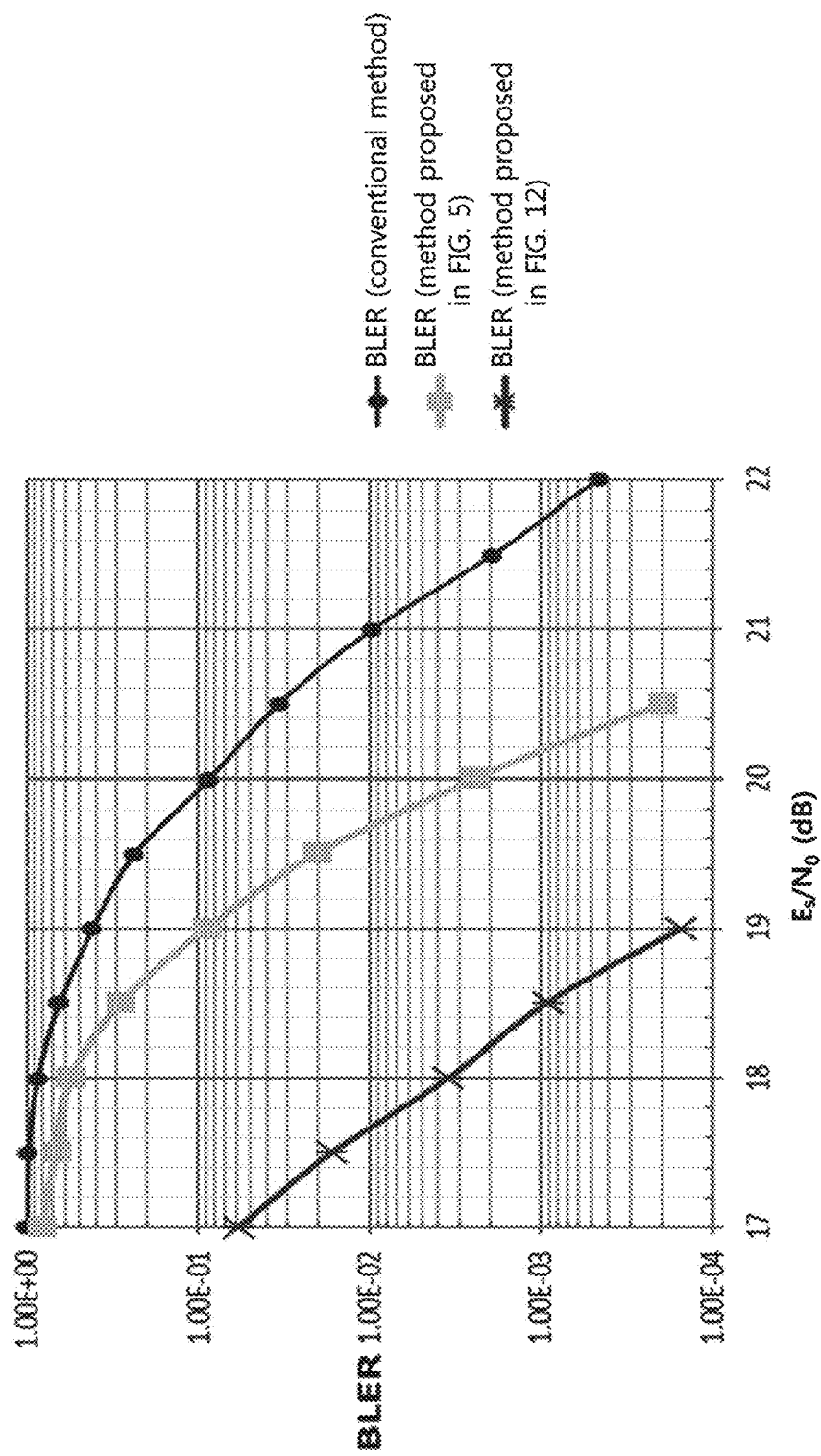

FIG. 15A is a second graph showing a BER according to the method shown in FIG. 12 and a BER according to the conventional method, and FIG. 15B is a second graph showing a BLER according to the method shown in FIG. 12 and a BLER according to the conventional method.

Referring to FIGS. 15A and 15B, the length N of the mother coded bits that are inputs of the polar encoder 1212 may be 1024, and the size K of information bits may be 512. The modulation scheme may be the 256 QAM scheme. In the graph shown in FIG. 15A, $E_s/N_0$ according to the method shown in FIG. 12 at the BER of 1E-4 may be smaller by 3.1 dB or more, than $E_s/N_0$ according to the conventional method, and $E_s/N_0$ according to the method shown 12 at the BER of 1E-3 may be smaller by 1.5 dB or more, than $E_s/N_0$ according to the method shown in FIG. 5. In the graph shown in FIG. 15B, $E_s/N_0$ according to the method shown in FIG. 12 at the BLER of 1E-3 may be smaller by 3.2 dB or more, than $E_s/N_0$ according to the conventional method, and $E_s/N_0$ according to the method shown in FIG. 12 at the BLER of 1E-3 may be smaller by 1.6 dB or more, than $E_s/N_0$ according to the method shown in FIG. 5. That is, according to the method illustrated in FIG. 12, the efficiency of transmission power can be improved. Here, each of BER and BLER may be BER and BLER in the AWGN environment.

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A method of processing a transmission signal, performed by a communication node, in a communication system, the method comprising:
grouping a coded bit sequence including a plurality of coded bits into a plurality of groups;
comparing indices of code bits belonging to a first group among the plurality of groups and indices of code bits belonging to a second group among the plurality of groups;
configuring the coded bits belonging to the first group as higher bits among bits constituting each modulation symbol based on a result of comparing the indices of the coded bits;
configuring the coded bits belonging to the second group as lower bits among the bits constituting each modulation symbol based on the result of comparing the indices of the code bits; and
generating the each modulation symbol by using the higher bits and the lower bits.

2. The method according to claim 1, wherein the coded bit sequence is a result of polar encoding for a mother coded bit sequence including information bits and frozen bits arranged according to channel reliability.

3. The method according to claim 1, wherein a number of the plurality of groups is half a number of bits constituting each modulation symbol.

4. The method according to claim 1, wherein the plurality of groups are configured according to an order of indices of the plurality of coded bits, and indices of code bits belonging to each of the plurality of groups are consecutive.

5. The method according to claim 1, wherein each of the higher bits and the lower bits are configured in units of 2 bits.

6. The method according to claim 1, wherein when the indices of the coded bits belonging to the first group are greater than the indices of the coded bits belonging to the second group, the coded bits belonging to the first group are configured as the higher bits, and the coded bits belonging to the second group are configured as the lower bits.

7. The method according to claim 1, further comprising:
arranging the plurality of coded bits included in the coded bit sequence according to channel reliability,
wherein the plurality of groups are configured based on the plurality of coded bits arranged according to channel reliability.

8. The method according to claim 1, further comprising:
changing an arrangement order of the plurality of groups; and
resetting the indices of the plurality of coded bits belonging to the plurality of groups arranged based on the changed arrangement order, according to a preconfigured rule,
wherein in the comparing of the indices of the coded bits, the indices reset according to the preconfigured rule are compared.

9. The method according to claim 1, further comprising:
performing an interleaving operation on the plurality of groups; and
resetting the indices of the plurality of coded bits belonging to the plurality of groups to which the interleaving operation is applied, according to a preconfigured rule,
wherein in the comparing of the indices of the coded bits, the indices reset according to the preconfigured rule are compared.

10. A method of processing a received signal, performed by a communication node, in a communication system, the method comprising:
obtaining log likelihood ratio (LLR) value(s) by performing a demodulation operation on a plurality of modulation symbols included in a received signal;
placing LLR value(s) associated with higher bits among bits constituting each of the plurality of modulation symbols in a first group among a plurality of groups;
placing LLR value(s) associated with lower bits among the bits constituting each of the plurality of modulation symbols in a second group among the plurality of groups;
generating an LLR sequence by performing a de-grouping operation on the first group and the second group; and
obtaining a bit sequence by performing a polar decoding operation on the LLR sequence.

11. The method according to claim 10, further comprising:
re-arranging the LLR sequence according to channel reliability,
wherein the polar decoding operation is performed on the re-arranged LLR sequence.

12. The method according to claim 10, wherein a number of the plurality of groups is half a number of bits constituting each modulation symbol.

13. The method according to claim 10, wherein the bit sequence includes information bits and frozen bits, and the information bits are re-arranged according to channel reliability.

14. A communication node for performing a processing operation of a transmission signal in a communication system, the communication node comprising:
a processor:
a memory electronically communicating with the processor; and
instructions stored in the memory,
wherein when executed by the processor, the instructions cause the communication node to:
group a coded bit sequence including a plurality of coded bits into a plurality of groups;
compare indices of code bits belonging to a first group among the plurality of groups and indices of code bits belonging to a second group among the plurality of groups;
configure the coded bits belonging to the first group as higher bits among bits constituting each modulation symbol based on a result of comparing the indices of the coded bits;
configure the coded bits belonging to the second group as lower bits among the bits constituting each modulation symbol based on the result of comparing the indices of the code bits; and
generate the each modulation symbol by using the higher bits and the lower bits.

15. The communication node according to claim 14, wherein a number of the plurality of groups is half a number of bits constituting each modulation symbol.

16. The communication node according to claim 14, wherein the plurality of groups are configured according to an order of indices of the plurality of coded bits, and indices of code bits belonging to each of the plurality of groups are consecutive.

17. The communication node according to claim 14, wherein when the indices of the coded bits belonging to the first group are greater than the indices of the coded bits belonging to the second group, the coded bits belonging to the first group are configured as the higher bits, and the coded bits belonging to the second group are configured as the lower bits.

18. The communication node according to claim 14, wherein the instructions further cause the communication node to arrange the plurality of coded bits included in the coded bit sequence according to channel reliability,
   wherein the plurality of groups are configured based on the plurality of coded bits arranged according to channel reliability.

19. The communication node according to claim 14, wherein the instructions further cause the communication node to:
   change an arrangement order of the plurality of groups; and
   reset the indices of the plurality of coded bits belonging to the plurality of groups arranged based on the changed arrangement order, according to a preconfigured rule,
   wherein in the comparing of the indices of the coded bits, the indices reset according to the preconfigured rule are compared.

20. The communication node according to claim 14, wherein the instructions further cause the communication node to:
   perform an interleaving operation on the plurality of groups; and
   reset the indices of the plurality of coded bits belonging to the plurality groups to which the interleaving operation is applied, according to a preconfigured rule,
   wherein in the comparing of the indices of the coded bits, the indices reset according to the preconfigured rule are compared.

* * * * *